United States Patent [19]
Shoji et al.

[11] Patent Number: 5,245,549
[45] Date of Patent: Sep. 14, 1993

[54] GATE ADDRESSING SYSTEM FOR LOGIC SIMULATION MACHINE

[75] Inventors: Minoru Shoji, Kawasaki; Fumiyasu Hirose, Yokohama, both of Japan

[73] Assignee: Fujitsu Limited, Kawasaki, Japan

[21] Appl. No.: 647,704

[22] Filed: Jan. 29, 1991

[30] Foreign Application Priority Data

Jan. 29, 1990 [JP] Japan ................ 2-018420
Aug. 18, 1990 [JP] Japan ................ 2-217829

[51] Int. Cl.⁵ ............................................. G06F 15/60
[52] U.S. Cl. ................................. 364/489; 364/488; 364/578
[58] Field of Search ............... 364/578, 488, 489, 490, 364/491; 371/23

[56] References Cited
U.S. PATENT DOCUMENTS

| | | | |
|---|---|---|---|
| 4,816,999 | 3/1989 | Berman et al. | 364/489 |
| 4,899,273 | 2/1990 | Omoda et al. | 371/23 |
| 4,924,429 | 5/1990 | Kurashita et al. | 364/578 |
| 5,051,938 | 9/1991 | Hyduke | 364/578 |
| 5,051,941 | 9/1991 | Takamine et al. | 364/578 |

FOREIGN PATENT DOCUMENTS 3652 1/1984 Japan.

*Primary Examiner*—Vincent N. Trans
*Attorney, Agent, or Firm*—Staas & Halsey

[57] ABSTRACT

A gate addressing system of a logic simulation machine performs translation from data of a circuit design data base to circuit data for the logic simulation machine. The system numbers each input terminal of a circuit and each gate of said circuit without using numbers corresponding to the number of fanout gates minus one to which an output signal of an input terminal or a gate is applied between the numbers of one input terminal and another input terminal, one input terminal and one gate, one gate and another gate or one gate and one input terminal. It starts a list of numbers of fanout gates of each input terminal or each gate at an address as the number assigned to said input terminal and gate in a table representing connection relationships among input terminals and gates and among gates.

10 Claims, 37 Drawing Sheets

```
┌─ 10 ─────────────────────┐      ┌─ 11 ─────────────────────┐
│  THE INPUT TERMINALS AND │      │  A TABLE REPRESENTING    │
│  THE OUTPUTS OF GATES ARE│      │  CONNECTION RELATIONSHIPS│
│  NUMBERED AMONG INPUT    │      │  BETWEEN AN INPUT TERMINAL│
│  TERMINALS, BETWEEN INPUT│      │  AND A GATE AND AMONG GATES│
│  TERMINALS AND GATES OR  │──────▶│  IS CONFIGURED SUCH THAT A│
│  AMONG GATES, AND WITHOUT│      │  LIST OF FANOUT GATES OF INPUT│
│  USING A NUMBER CORRESPONDING│  │  TERMINALS AND GATES STARTS│
│  TO THE NUMBER OF FANOUT GATES│ │  AT ADDRESSES AS NUMBERS │
│  TO WHICH AN OUTPUT SIGNAL OF│ │  ASSIGNED TO THE INPUT   │
│  EACH GATE OR EACH INPUT │      │  TERMINALS AND GATES.    │
│  TERMINAL IS APPLIED MINUS ONE.│ └──────────────────────────┘
└──────────────────────────┘
```

FIG. 5

| ADR | END | PTR | ADD | GATE | INO |
|---|---|---|---|---|---|
| *0  | 1 | 0 | 0 |   0  | 0 |
| *1  | 0 | 0 | 1 | + 9  | 0 |
|  2  | 0 | 0 | 1 | +15  | 0 |
|  3  | 1 | 0 | 1 | +15  | 1 |
| *4  | 0 | 0 | 1 | + 8  | 0 |
|  5  | 0 | 0 | 1 | +11  | 0 |
|  6  | 1 | 0 | 1 | +12  | 0 |
| *7  | 0 | 0 | 1 | + 7  | 0 |
|  8  | 0 | 0 | 1 | + 8  | 1 |
|  9  | 1 | 0 | 1 | + 8  | 1 |
| *10 | 0 | 0 | 1 | + 6  | 2 |
|  11 | 1 | 0 | 1 | + 8  | 2 |
| *12 | 0 | 0 | 1 | + 8  | 2 |
|  13 | 1 | 0 | 1 | + 7  | 1 |
| *14 | 0 | 0 | 1 | + 4  | 2 |
|  15 | 1 | 0 | 1 | + 4  | 0 |
| *16 | 1 | 0 | 1 | + 4  | 0 |
| *17 | 1 | 0 | 1 | + 3  | 1 |
| *18 | 1 | 0 | 1 | + 2  | 2 |
| *19 | 1 | 0 | 1 | + 1  | 3 |
| *20 | 1 | 1 | 0 |  200 |   |
| *21 | 0 | 0 | 1 | + 9  | 0 |
|  22 | 0 | 0 | 1 | +15  | 0 |
|  23 | 1 | 0 | 1 | +15  | 1 |
| *24 | 0 | 0 | 1 | + 8  | 0 |
|  25 | 0 | 0 | 1 | +11  | 0 |
|  26 | 1 | 0 | 1 | +12  | 0 |
| *27 | 0 | 0 | 1 | + 7  | 0 |
|  28 | 0 | 0 | 1 | + 8  | 1 |
|  29 | 1 | 0 | 1 | + 8  | 1 |
| *30 | 0 | 0 | 1 | + 6  | 2 |
|  31 | 1 | 0 | 1 | + 8  | 2 |
| *32 | 0 | 0 | 1 | + 8  | 2 |
|  33 | 1 | 0 | 1 | + 7  | 1 |
| *34 | 0 | 0 | 1 | + 4  | 2 |
|  35 | 1 | 0 | 1 | + 4  | 0 |
| *36 | 1 | 0 | 1 | + 4  | 0 |
| *37 | 1 | 0 | 1 | + 3  | 1 |
| *38 | 1 | 0 | 1 | + 2  | 2 |
| *39 | 1 | 0 | 1 | + 1  | 3 |
| *40 | 1 | 1 | 0 |  210 |   |

FIG. 6

| ADR | END | PTR | ADD | GATE | INO |
|---|---|---|---|---|---|
| *41 | 0 | 0 | 1 | + 9 | 0 |
| 42 | 0 | 0 | 1 | +15 | 0 |
| 43 | 1 | 0 | 1 | +15 | 1 |
| *44 | 0 | 0 | 1 | + 8 | 0 |
| 45 | 0 | 0 | 1 | +11 | 0 |
| 46 | 1 | 0 | 1 | +12 | 0 |
| *47 | 0 | 0 | 1 | + 7 | 0 |
| 48 | 0 | 0 | 1 | + 8 | 1 |
| 49 | 1 | 0 | 1 | + 8 | 1 |
| *50 | 0 | 0 | 1 | + 6 | 2 |
| 51 | 1 | 0 | 1 | + 8 | 2 |
| *52 | 0 | 0 | 1 | + 8 | 2 |
| 53 | 1 | 0 | 1 | + 7 | 1 |
| *54 | 0 | 0 | 1 | + 4 | 2 |
| 55 | 1 | 0 | 1 | + 4 | 0 |
| *56 | 1 | 0 | 1 | + 4 | 0 |
| *57 | 1 | 0 | 1 | + 3 | 1 |
| *58 | 1 | 0 | 1 | + 2 | 2 |
| *59 | 1 | 0 | 1 | + 1 | 3 |
| *60 | 1 | 1 | 0 | 220 | |
| *61 | 0 | 0 | 1 | + 9 | 0 |
| 62 | 0 | 0 | 1 | +15 | 0 |
| 63 | 1 | 0 | 1 | +15 | 1 |
| *64 | 0 | 0 | 1 | + 8 | 0 |
| 65 | 0 | 0 | 1 | +11 | 0 |
| 66 | 1 | 0 | 1 | +12 | 0 |
| *67 | 0 | 0 | 1 | + 7 | 0 |
| 68 | 0 | 0 | 1 | + 8 | 1 |
| 69 | 1 | 0 | 1 | + 8 | 1 |
| *70 | 0 | 0 | 1 | + 6 | 2 |
| 71 | 1 | 0 | 1 | + 8 | 2 |
| *72 | 0 | 0 | 1 | + 8 | 2 |
| 73 | 1 | 0 | 1 | + 7 | 1 |
| *74 | 0 | 0 | 1 | + 4 | 2 |
| 75 | 1 | 0 | 1 | + 4 | 0 |
| *76 | 1 | 0 | 1 | + 4 | 0 |
| *77 | 1 | 0 | 1 | + 3 | 1 |
| *78 | 1 | 0 | 1 | + 2 | 2 |
| *79 | 1 | 0 | 1 | + 1 | 3 |
| *80 | 1 | 1 | 0 | 0 | |

FIG. 7

| ADR | END | PTR | ADD | GATE | INO |
|---|---|---|---|---|---|
| *81 | 0 | 0 | 1 | + 9 | 0 |
| 82 | 0 | 0 | 1 | +15 | 0 |
| 83 | 1 | 0 | 1 | +15 | 1 |
| *84 | 0 | 0 | 1 | + 8 | 0 |
| 85 | 0 | 0 | 1 | +11 | 0 |
| 86 | 1 | 0 | 1 | +12 | 0 |
| *87 | 0 | 0 | 1 | + 7 | 0 |
| 88 | 0 | 0 | 1 | + 8 | 1 |
| 89 | 1 | 0 | 1 | + 8 | 1 |
| *90 | 0 | 0 | 1 | + 6 | 2 |
| 91 | 1 | 0 | 1 | + 8 | 2 |
| *92 | 0 | 0 | 1 | + 8 | 2 |
| 93 | 1 | 0 | 1 | + 7 | 1 |
| *94 | 0 | 0 | 1 | + 4 | 2 |
| 95 | 1 | 0 | 1 | + 4 | 0 |
| *96 | 1 | 0 | 1 | + 4 | 0 |
| *97 | 1 | 0 | 1 | + 3 | 1 |
| *98 | 1 | 0 | 1 | + 2 | 2 |
| *99 | 1 | 0 | 1 | + 1 | 3 |
| *100 | 1 | 1 | 0 | 0 | |
| 200 | 0 | 0 | 0 | 101 | 0 |
| 201 | 1 | 1 | 0 | 81 | |
| 210 | 0 | 0 | 0 | 102 | 0 |
| 211 | 1 | 1 | 1 | 84 | |
| 220 | 0 | 0 | 0 | 103 | 0 |
| 221 | 1 | 1 | 0 | 87 | |
| 101 | 1 | 1 | 0 | 61 | |
| 102 | 1 | 1 | 0 | 64 | |
| 103 | 1 | 1 | 0 | 67 | |

(TOTAL 110 ADDRESSES)

INSIDE CORRESPONDS TO GATES
10, 12, 14, 16, 17, 18, 19, AND 20 OF FIG. 4

FIG. 13

| ADR | END | PTR | ADD | GATE/BASE1 | INO/BASE2 |
|---|---|---|---|---|---|
| 0 | 1 | 0 | 0 | 0 | 0 |
| 1 | 1 | 1 | 0 | 100 | 0 |
| 2 | 1 | 1 | 0 | 103 | 0 |
| 3 | 1 | 1 | 0 | 106 | 0 |
| 4 | 1 | 1 | 0 | 109 | 0 |
| 5 | 1 | 1 | 0 | 111 | 0 |
| 6 | 1 | 1 | 0 | 113 | 0 |
| 7 | 1 | 1 | 0 | 114 | 0 |
| 8 | 1 | 1 | 0 | 115 | 0 |
| 9 | 1 | 1 | 0 | 116 | 0 |
| 10 | 1 | 1 | 0 | 117 | 0 |
| 11 | 1 | 1 | 0 | 200 | 0 |
| 21 | 1 | 1 | 0 | 100 | 20 |
| 22 | 1 | 1 | 0 | 103 | 20 |
| 23 | 1 | 1 | 0 | 106 | 20 |
| 24 | 1 | 1 | 0 | 109 | 20 |
| 25 | 1 | 1 | 0 | 111 | 20 |
| 26 | 1 | 1 | 0 | 113 | 20 |
| 27 | 1 | 1 | 0 | 114 | 20 |
| 28 | 1 | 1 | 0 | 115 | 20 |
| 29 | 1 | 1 | 0 | 116 | 20 |
| 30 | 1 | 1 | 0 | 117 | 20 |
| 31 | 1 | 1 | 0 | 202 | 0 |
| 41 | 1 | 1 | 0 | 100 | 40 |
| 42 | 1 | 1 | 0 | 103 | 40 |
| 43 | 1 | 1 | 0 | 106 | 40 |
| 44 | 1 | 1 | 0 | 109 | 40 |
| 45 | 1 | 1 | 0 | 111 | 40 |
| 46 | 1 | 1 | 0 | 113 | 40 |
| 47 | 1 | 1 | 0 | 114 | 40 |
| 48 | 1 | 1 | 0 | 115 | 40 |
| 49 | 1 | 1 | 0 | 116 | 40 |
| 50 | 1 | 1 | 0 | 117 | 40 |
| 51 | 1 | 1 | 0 | 204 | 0 |
| 61 | 1 | 1 | 0 | 100 | 60 |
| 62 | 1 | 1 | 0 | 103 | 60 |
| 63 | 1 | 1 | 0 | 106 | 60 |
| 64 | 1 | 1 | 0 | 109 | 60 |
| 65 | 1 | 1 | 0 | 111 | 60 |
| 66 | 1 | 1 | 0 | 113 | 60 |
| 67 | 1 | 1 | 0 | 114 | 60 |
| 68 | 1 | 1 | 0 | 115 | 60 |
| 69 | 1 | 1 | 0 | 116 | 60 |
| 70 | 1 | 1 | 0 | 117 | 60 |
| 71 | 1 | 1 | 0 | 0 | 0 |

FIG. 14

| ADR | END | PTR | ADD | GATE/<br>BASE1 | INO/<br>BASE2 |
|---|---|---|---|---|---|
| 81 | 1 | 1 | 0 | 100 | 80 |
| 82 | 1 | 1 | 0 | 103 | 80 |
| 83 | 1 | 1 | 0 | 106 | 80 |
| 84 | 1 | 1 | 0 | 109 | 80 |
| 85 | 1 | 1 | 0 | 111 | 80 |
| 86 | 1 | 1 | 0 | 113 | 80 |
| 87 | 1 | 1 | 0 | 114 | 80 |
| 88 | 1 | 1 | 0 | 115 | 80 |
| 89 | 1 | 1 | 0 | 116 | 80 |
| 90 | 1 | 1 | 0 | 117 | 80 |
| 91 | 1 | 1 | 0 | 0 | 0 |
| 96 | 1 | 1 | 0 | 100 | 60 |
| 97 | 1 | 1 | 0 | 103 | 60 |
| 98 | 1 | 1 | 0 | 106 | 60 |
| 100 | 0 | 0 | 1 | -96 | 0 |
| 101 | 0 | 0 | 1 | -93 | 0 |
| 102 | 1 | 0 | 1 | -93 | 1 |
| 103 | 0 | 0 | 1 | -98 | 0 |
| 104 | 0 | 0 | 1 | -97 | 0 |
| 105 | 1 | 0 | 1 | -96 | 0 |
| 106 | 0 | 0 | 1 | -100 | 0 |
| 107 | 0 | 0 | 1 | -100 | 1 |
| 108 | 1 | 0 | 1 | -100 | 1 |
| 109 | 0 | 0 | 1 | -102 | 2 |
| 110 | 1 | 1 | 1 | -100 | 2 |
| 111 | 0 | 0 | 1 | -103 | 2 |
| 112 | 1 | 0 | 1 | -102 | 1 |
| 113 | 0 | 0 | 1 | -104 | 2 |
| 114 | 1 | 0 | 1 | -104 | 0 |
| 115 | 1 | 0 | 1 | -104 | 0 |
| 116 | 1 | 0 | 1 | -105 | 1 |
| 117 | 1 | 0 | 1 | -106 | 2 |
| 118 | 1 | 0 | 1 | -107 | 3 |
| 200 | 0 | 0 | 0 | 96 | 0 |
| 201 | 1 | 1 | 0 | 100 | 80 |
| 202 | 0 | 0 | 0 | 97 | 0 |
| 203 | 1 | 1 | 0 | 103 | 80 |
| 204 | 0 | 0 | 0 | 98 | 0 |
| 205 | 1 | 1 | 0 | 106 | 80 |

(TOTAL 84 ADDRESSES)

INSIDE CORRESPONDS TO GATES
4, 5, 6, 7, 8, 9, 10, 11, AND 12 OF FIG. 12

( ☐ : DATA TRANSFER    ◯ : COPY)

FIG. 25B

26: INTRAMODULE CONNECTION LIST

| END BIT | ADDRESS BIT | ADDRESS |
|---|---|---|
| 0 | 0 | 1 |
| 1 | 1 | 2 |
| 1 | 0 | 3 |
| 1 | 0 | 4 |
| 1 | 1 | 5 |
| 0 | 0 | 6 |
| 1 | 0 | 7 |
| 1 | 0 | 8 |
| 1 | 0 | 9 |

Rows (address → value):
- 1: 3-in0
- 2: 5-in0
- 3: 5-in1
- 4: (empty)
- 5: (empty)
- 6: 1-in0
- 7: 4-in0
- 8: 1-in0
- 9: 4-in0

Addresses 1–5: INTERGATE CONNECTION RECORDING SECTION 75
Addresses 6–9: EXTERNAL INPUT-TO-GATE CONNECTION RECORDING SECTION 76
(MODULE 1)

27: INTERMODULE CONNECTION LIST

| END BIT | ADDRESS BIT | ADDRESS |
|---|---|---|
|  | 1 | 101 |
|  | 1 | 102 |
|  | 1 | 103 |
|  | 1 | 104 |
|  | 1 | 105 |
|  | 1 | 106 |
|  |   | 107 |
|  |   | 108 |
|  |   | 109 |
|  |   | 110 |

CONNECTION OF A MODULE

FIG. 27B

| END BIT | | ADDRESS |
|---|---|---|
| 0 | 3-in0 | 1 |
| 1 | 104-in | 2 ← Ⓒ |
| 1 | 5-in0 | 3 |
| 1 | 5-in1 | 4 |
| 1 | 106-in | 5 |
| 0 | 1-in0 | 6 |
| 1 | 4-in0 | 7 |
| 1 | 1-in1 | 8 |
| 1 | 4-in1 | 9 |

26: INTRAMODULE CONNECTION LIST

| END BIT | | ADDRESS |
|---|---|---|
| 1 | 6-in | 101 |
| 1 | 8-in | 102 |
| 1 | 9-in | 103 |
| 0 | 28-in | 104 Ⓒ' |
| 1 | 45-in | 105 |
| 0 | 57-in | 106 |
| 1 | 88-in | 107 |
| | | 108 |
| | | 109 |
| | | 110 |

27: INTERMODULE CONNECTION LIST

EXAMPLE OF LIST

FIG. 31
PRIOR ART

<FANI>

| ADR | END | PTR | GATE | INO |
|-----|-----|-----|------|-----|
| 0   | 1   | 1   |      |     |
| 1   | 1   | 1   | 101  |     |
| 2   | 1   | 1   | 104  |     |
| 3   | 1   | 1   | 107  |     |
| 4   | 1   | 1   | 131  |     |
| 5   | 1   | 1   | 134  |     |
| 6   | 1   | 1   | 137  |     |
| 7   | 1   | 1   | 161  |     |
| 8   | 1   | 1   | 164  |     |
| 9   | 1   | 1   | 167  |     |
| 10  | 1   | 1   | 110  |     |
| 11  | 1   | 1   | 112  |     |
| 12  | 1   | 1   | 114  |     |
| 13  | 1   | 1   | 116  |     |
| 14  | 1   | 1   | 117  |     |
| 15  | 1   | 1   | 118  |     |
| 16  | 1   | 1   | 119  |     |
| 17  | 1   | 1   | 120  |     |
| ..  | .   | .   | ...  |     |
| 20  | 1   | 1   | 140  |     |
| 21  | 1   | 1   | 142  |     |
| 22  | 1   | 1   | 144  |     |
| 23  | 1   | 1   | 146  |     |
| 24  | 1   | 1   | 147  |     |
| 25  | 1   | 1   | 148  |     |
| 26  | 1   | 1   | 149  |     |
| 27  | 1   | 1   | 150  |     |
| ..  | .   | .   | ...  |     |
| 30  | 1   | 1   | 170  |     |
| 31  | 1   | 1   | 172  |     |
| 32  | 1   | 1   | 174  |     |
| 33  | 1   | 1   | 176  |     |
| 34  | 1   | 1   | 177  |     |
| 35  | 1   | 1   | 178  |     |
| 36  | 1   | 1   | 179  |     |
| 37  | 1   | 1   | 180  |     |
| ..  | .   | .   | ...  |     |
| 40  | 1   | 1   | 200  |     |
| 41  | 1   | 1   | 202  |     |
| 42  | 1   | 1   | 204  |     |
| 43  | 1   | 1   | 206  |     |
| 44  | 1   | 1   | 207  |     |
| 45  | 1   | 1   | 208  |     |
| 46  | 1   | 1   | 209  |     |
| 47  | 1   | 1   | 210  |     |
| ..  | .   | .   | ...  |     |

FIG. 32
PRIOR ART

<FANI>

| ADR | END | PTR | GATE | INO |
|-----|-----|-----|------|-----|
| 50  | 1   | 1   | 230  |     |
| 51  | 1   | 1   | 232  |     |
| 52  | 1   | 1   | 234  |     |
| 53  | 1   | 1   | 236  |     |
| 54  | 1   | 1   | 237  |     |
| 55  | 1   | 1   | 238  |     |
| 56  | 1   | 1   | 239  |     |
| 57  | 1   | 1   | 230  |     |
| ... | ... | ... | ...  |     |
| 101 | 0   | 0   | 10   | 0   |
| 102 | 0   | 0   | 14   | 0   |
| 103 | 1   | 0   | 15   | 1   |
| 104 | 0   | 0   | 11   | 0   |
| 105 | 0   | 0   | 13   | 0   |
| 106 | 1   | 0   | 15   | 0   |
| 107 | 0   | 0   | 12   | 0   |
| 108 | 0   | 0   | 13   | 1   |
| 109 | 1   | 0   | 14   | 1   |
| 110 | 0   | 0   | 13   | 2   |
| 111 | 1   | 0   | 16   | 2   |
| 112 | 0   | 0   | 14   | 2   |
| 113 | 1   | 0   | 16   | 1   |
| 114 | 0   | 0   | 15   | 2   |
| 115 | 1   | 0   | 16   | 0   |
| 116 | 1   | 0   | 17   | 0   |
| 117 | 1   | 0   | 17   | 1   |
| 118 | 1   | 0   | 17   | 2   |
| 119 | 1   | 0   | 17   | 3   |
| 120 | 0   | 0   | 60   | 0   |
| 121 | 0   | 0   | 50   | 0   |
| 122 | 0   | 0   | 54   | 0   |
| 123 | 1   | 0   | 55   | 1   |

FIG. 33
PRIOR ART

<FANI>

| ADR | END | PTR | GATE | INO |
|---|---|---|---|---|
| ... | . | . | .. | . |
| 131 | 0 | 0 | 20 | 0 |
| 132 | 0 | 0 | 24 | 0 |
| 133 | 1 | 0 | 25 | 1 |
| 134 | 0 | 0 | 21 | 0 |
| 135 | 0 | 0 | 23 | 0 |
| 136 | 1 | 0 | 25 | 0 |
| 137 | 0 | 0 | 22 | 0 |
| 138 | 0 | 0 | 23 | 1 |
| 139 | 1 | 0 | 24 | 1 |
| 140 | 0 | 0 | 23 | 2 |
| 141 | 1 | 0 | 26 | 2 |
| 142 | 0 | 0 | 24 | 2 |
| 143 | 1 | 0 | 26 | 1 |
| 144 | 0 | 0 | 25 | 2 |
| 145 | 1 | 0 | 26 | 0 |
| 146 | 1 | 0 | 27 | 0 |
| 147 | 1 | 0 | 27 | 1 |
| 148 | 1 | 0 | 27 | 2 |
| 149 | 1 | 0 | 27 | 3 |
| 150 | 0 | 0 | 61 | 0 |
| 151 | 0 | 0 | 51 | 0 |
| 152 | 0 | 0 | 53 | 0 |
| 153 | 1 | 0 | 55 | 0 |
| ... | . | . | .. | . |
| 170 | 0 | 0 | 33 | 2 |
| 171 | 1 | 0 | 36 | 2 |
| 172 | 0 | 0 | 34 | 2 |
| 173 | 1 | 0 | 36 | 1 |
| 174 | 0 | 0 | 35 | 2 |
| 175 | 1 | 0 | 36 | 0 |
| 176 | 1 | 0 | 37 | 0 |
| 177 | 1 | 0 | 37 | 1 |
| 178 | 1 | 0 | 37 | 2 |
| 179 | 1 | 0 | 37 | 3 |
| 180 | 0 | 0 | 62 | 0 |
| 181 | 0 | 0 | 52 | 0 |
| 182 | 0 | 0 | 53 | 1 |
| 183 | 1 | 0 | 54 | 1 |
| ... | . | . | .. | . |

FIG. 34
PRIOR ART

<FANI>

| ADR | END | PTR | GATE | INO |
|-----|-----|-----|------|-----|
| 200 | 0 | 0 | 43 | 2 |
| 201 | 1 | 0 | 46 | 2 |
| 202 | 0 | 0 | 44 | 2 |
| 203 | 1 | 0 | 46 | 0 |
| 204 | 0 | 0 | 45 | 2 |
| 205 | 1 | 0 | 46 | 0 |
| 206 | 0 | 0 | 47 | 0 |
| 207 | 0 | 0 | 47 | 1 |
| 208 | 0 | 0 | 47 | 2 |
| 209 | 1 | 0 | 47 | 3 |
| 210 | 1 | 0 | 0 | 0 |
| ... | . | . | .. | . |
| 230 | 0 | 0 | 53 | 2 |
| 231 | 1 | 0 | 56 | 2 |
| 232 | 0 | 0 | 54 | 2 |
| 233 | 1 | 0 | 55 | 2 |
| 234 | 0 | 0 | 55 | 2 |
| 235 | 1 | 0 | 56 | 0 |
| 236 | 1 | 0 | 57 | 0 |
| 237 | 1 | 0 | 57 | 1 |
| 238 | 1 | 0 | 57 | 2 |
| 239 | 1 | 0 | 57 | 3 |
| 240 | 1 | 0 | 0 | 0 |
| ... | . | . | .. | . |
| 60 | 1 | 1 | 300 | |
| 61 | 1 | 1 | 303 | |
| 62 | 1 | 1 | 306 | |
| ... | . | . | .. | . |
| 300 | 0 | 0 | 40 | 0 |
| 301 | 0 | 0 | 44 | 0 |
| 302 | 1 | 0 | 45 | 1 |
| 303 | 0 | 0 | 41 | 0 |
| 304 | 0 | 0 | 43 | 0 |
| 305 | 1 | 0 | 45 | 0 |
| 306 | 0 | 0 | 42 | 0 |
| 307 | 0 | 0 | 43 | 1 |
| 308 | 1 | 0 | 44 | 1 |

(TOTAL 141 ADDRESSES)

GATE ADDRESSING SYSTEM FOR LOGIC SIMULATION MACHINE

BACKGROUND OF THE INVENTION

1. Field of the Invention

The present invention relates to a logic simulation machine for carrying out a test program for a logic device and, more particularly, to a gate addressing system of a logic simulation machine for, at high speed, generating circuit data for simulation by reading at a high speed circuit model data for the logic simulation machine from a data base on a module-by-module basis and generating intermodule connection data.

Recent logic devices use many VLSIs. Thus, a single design deficiency in a logic device will greatly delay its development and increase its development cost. Therefore, the design of a logic device must be fully verified before it is manufactured. To this end, a designer uses a logic simulator to carry out a test program and the correctness of his design is confirmed when a comparison between results of the simulation and expected values indicates equality. However, recent devices may have several millions of gates and a clock rate as high as 1 GHz. It has been reported that the execution of the test program, which operates on an actual unit for only one minute, using a simulator as software on a large computer requires a period as long as 190 years. This is one billion times slower than the actual unit.

For this reason, a logic simulation machine was invented which is about 10,000 times faster than the conventional simulator described above. With this machine, the test program can be executed in about one week, thus considerably decreasing the verification time after a logic design has been completed to some extent.

To carry out the test program by the logic simulation machine, it is required to convert a data base for design to a circuit data base for a machine.

Heretofore, circuit data for a machine has been expanded to a flat (not hierarchical) form of element levels. The data is represented by types of elements and connection relationships among elements. The elements are generally gates and the types of elements represent AND, NOR, etc. The connection relationship represents, as a minimum, an element (and its input pin) connected to the output pin of a certain element. The connection relationship is represented by numbers which are uniquely assigned to elements and pins.

For example, the connection relationship in a circuit such as that shown in FIG. 29 is conventionally given as follows. First, unique numbers are assigned to gates, as shown in FIG. 30. The input pins of gates are consecutively numbered, starting with 0, from the top.

The connection relationships form a table which provides information on to which gates and to what numbered pin of these gates the output of a certain other gate is to be connected. For example, the output of the tenth gate is connected to the second pin of the thirteenth gate and the second pin of the sixteenth gate. The method of storing this information in the table will be explained with reference to FIGS. 31 through 34. In FIGS. 31 through 34, the first column ADR represents row numbers (addresses) of the table. Thus, the ADR does not represent information to be written into the table. The second column to the fifth column represent the actual contents of the table. The second column END indicates the end of the list of connection information (the list ends at 1). The third column PTR represents whether data in each row represents an actual gate number (PTR=0) or a pointer to the list in which gate numbers are written (PTR=1). The fourth column GATE represents a gate number when PTR=0 and points to a row number (or address) (address ADR) in the same table when PTR=1. The fifth column INO represents an input pin number when PTR=0 and has no meaning when PTR=1. To determine to which gate and to which of its inputs (plus) the output of the tenth gate is connected, the address 10 of the table is referred to. The address 10 indicates PTR=1 and points to the list starting with address 110. The list starting with the address 110 has two rows. This can be seen from that END=1 in address 111. Since PTR=0, gate numbers are written in these two rows. Thus, it will be appreciated that the output of the gate 10 is connected to the pin 2 of the gate 13 and the pin 2 of the gate 16. These gates, connected to the output pin of the gate 10, are called fanout gates. In general, it is said that the average number of fanout gates for one gate is three.

FIG. 35 is a block diagram of hardware for reading numbers of fanout gates from the conventional table with a data structure described in conjunction with FIGS. 31 through 34. This hardware comprises a memory (FAN) 1 for storing the data END, PTR, GATE and INO described in conjunction with FIGS. 31 to 34, an address register (FADR) 2 for designating an address for reading a fanout gate number from the memory 1, a multiplexer 3 and an OR circuit.

When the data END or PTR in the memory 1 is 1, the output of the OR circuit 4 is 1, in which case data from the multiplexer 3 is loaded into the address register 2. When either the END or PTR are both 0 and the output of OR circuit 4 is 0, however, the contents of the address register 2 are advanced. When PTR=1, the GATE in the memory 1 indicates a pointer value which is stored in the address register 2 via the multiplexer 3. When PTR=0 and END=1, the externally applied next gate number is entered into the address register 2 via the multiplexer 3. When END=1, a next signal is applied to the outside, which makes effective the externally applied next-gate number signal. This hardware is also used as the basis of an embodiment of the present invention and thus its operation will be described in detail below.

With the conventional compile method, it is necessary to assign up to one million unique gate numbers to gates when the number of the gates is one million, and to represent connection relationships among about three million fan-out gates of the one million gates using those gate numbers. This process is called compilation. For compilation of one million gates a CPU time as long as several hours is needed, even with a large computer. Although the ratio of the CPU time of a large computer to the actual processing time depends on the number of jobs which run in parallel, the actual processing time is three or more times slower. Thus, the compilation will need substantially a full day.

If the run time of the logic simulation machine is one week, the compile time is not a serious problem. When an error (disagreement between the result at a checkpoint of simulation and the expected value) is detected in the simulation machine, the continuation of the simulation is meaningless so long as a design deficiency that causes the error is not removed. The occurrence of many errors is inevitable in the initial stage of design in particular. Thus, the compile time becomes predominant, in which case the logic simulation machine cannot fully show its power.

The technical problems with the conventional data structure or gate addressing method are summarized as follows.

The first problem is that gates need to be reassigned unique consecutive numbers.

A logic device is generally designed hierarchically. Various units in the hierarchy include a level of an LSI or printed circuit board and a level of a logical block within an LSI. Circuit data is usually compiled in units of the hierarchy. To generate circuit data of the entire logic device, however, the gates must be reassigned unique consecutive numbers.

The second problem is that, even if the same partial circuit is used in plural locations, this fact is not utilized.

Actually, the circuit of FIG. 30 makes repeated use of a partial circuit (macro) of the same structure. A circuit comprising gates numbered 10 to 17 and input pins numbered 1 to 3 corresponds to this macro. Besides this macro, there are four identical macros in the circuit diagram (for example, a circuit comprised of gates 20 to 27 and input pins 4, 5 and 6 and a circuit comprised of gates 40 to 47 and input pins thereto which are shown unnumbered and connected to the output pins of the gates 60, 61 and 62). Such information is not utilized.

The third problem is that, with the data structure of the conventional table described in conjunction with FIGS. 31 to 34, addresses corresponding in number to (1+F)×the number of gates are required, F representing the average number (about three) of fan-outs of a gate. This increases the size of the table. For example, in FIGS. 31 to 34, data of ADR=1 is the pointer to the starting address 101 of the list of fan-out gates. By referring to the list in the addresses 101 to 103 it becomes possible to know the fan-outs of the gate numbered 1. That is, there are four (i.e. H3) table addresses for the gate numbered 1.

The fourth problem, which is similar to the second problem, is that the connection information on a certain partial circuit cannot be expanded on a memory to make repeated use of it for other partial circuits of the same structure.

The fifth problem is that, even if the entire circuit is composed of several modules, since a simulation model of each module is expanded once to the level of gates to generate the simulation model, the simulation model of a previously generated module cannot be used as it is and the recompilation of the entire circuit is needed even when some modules are subjected to modification.

SUMMARY OF THE INVENTION

It is an object of the present invention to generate circuit data for a logic simulation machine by reading circuit data from a data base at high speed on a module-by-module basis and thereby generate inter-module connection data by the use of a new data structure for decreasing a compile time.

A feature of the present invention resides in a gate addressing system of a logic simulation machine for performing translation from data of a circuit design data base to circuit data for the logic simulation machine, means for numbering each input terminal of a circuit and each gate of the circuit without using numbers determined based on the number of fanout gates to which an output signal of an input terminal or a gate is applied between numbers of one input terminal and another input terminal, one input terminal and one gate, one gate and another gate or one gate and one input terminal, and means for starting, in a table representing connection relationships among input terminals and gates and among gates, a list of numbers of fanout gates of each input terminal or each gate at an address corresponding to the number assigned to the input terminal and gate.

BRIEF DESCRIPTION OF THE DRAWINGS

FIGS. 5, 6 and 7 illustrate a table of first connection relationships corresponding to the first gate addressing system, FIGS. 13 and 14 illustrate a second connection relationship display table corresponding to the second gate addressing system, FIGS. 25A and 25B illustrate lists before compilation, FIGS. 27A and 27B illustrate intermodules connecting system using virtual gates, FIGS. 31 through 34 illustrate an example of a connection relationship display table corresponding to the conventional gate addressing system.

DESCRIPTION OF THE PREFERRED EMBODIMENTS

Figure 1A:
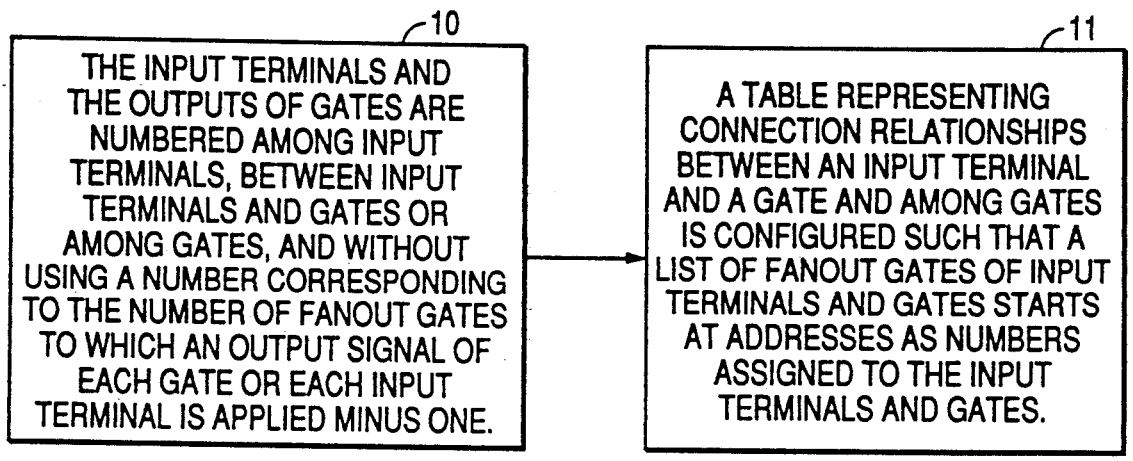
FIGS. 1A and 1B are functional block diagrams designating first and second principles of the present invention, respectively.
Figure 1B:
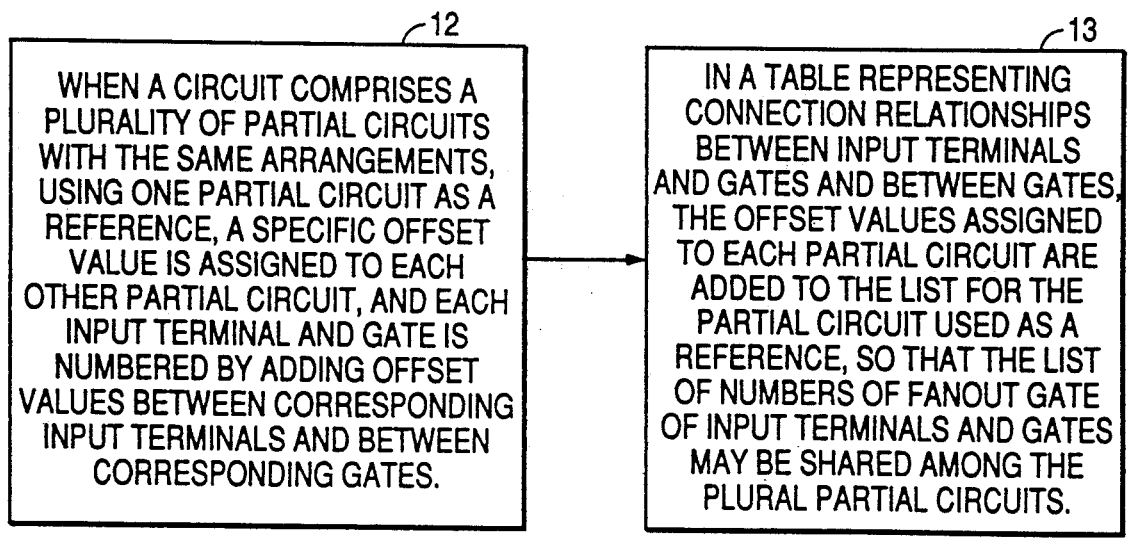

FIGS. 1A and 1B are functional block diagrams of first and second principles of the inventions, respectively. These functional block diagrams correspond to a gate addressing system at the time of translation from data in a circuit design data base to circuit data for a logic simulation machine, that is, a gate numbering system.

Figure 30:
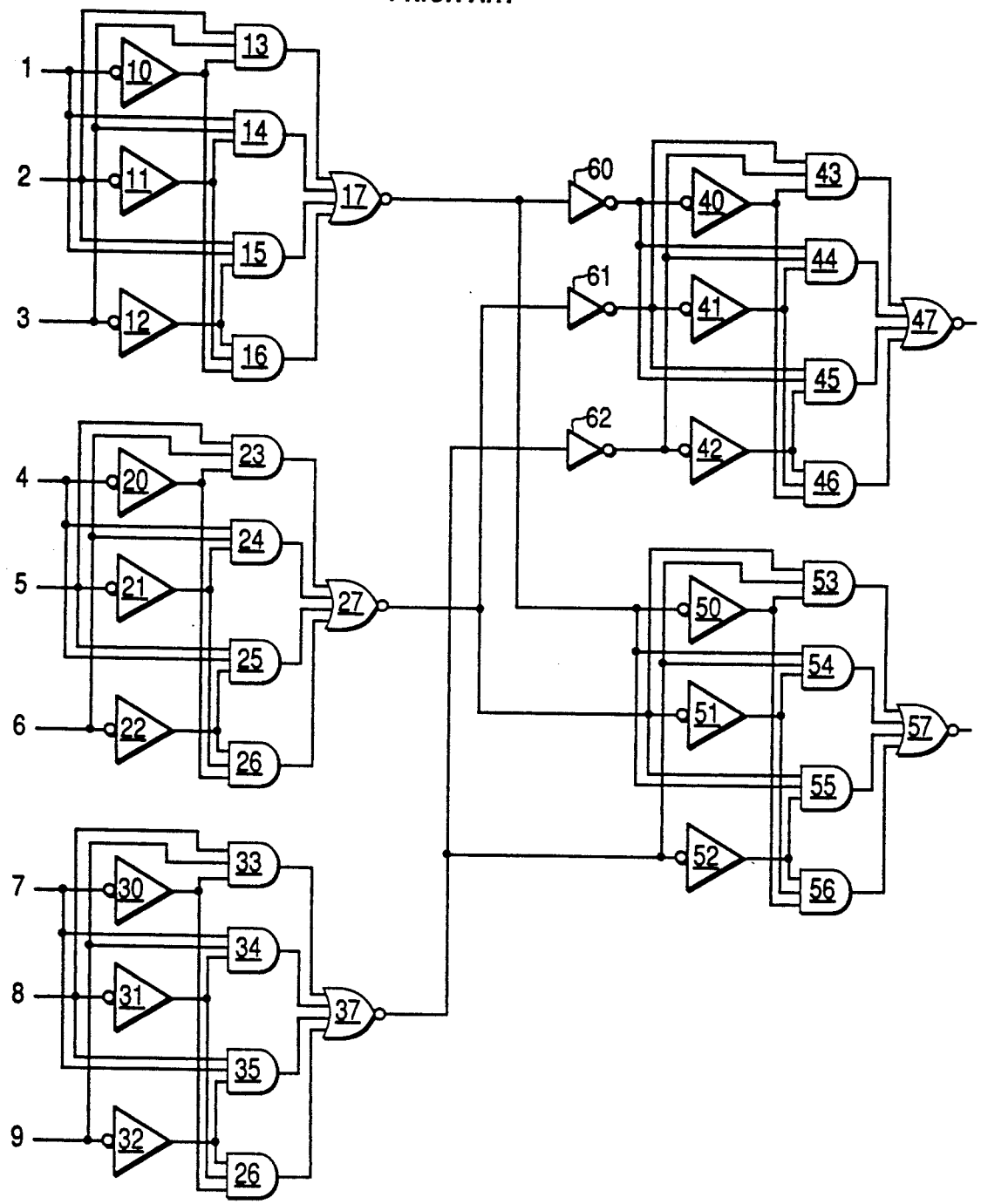
FIG. 30 illustrates a conventional gate addressing system.

In FIG. 1A, instead of performing consecutive numbering among input terminals of a circuit between the input terminal and the gate and among gates of the circuit as in FIG. 30, the input terminals and gates are numbered in block 10 skipping numbers corresponding to the number of fanout gates minus one to which an output signal of each input terminal or of each gate is applied. Since, for example, the number of fan-out gates of the input terminal numbered 1 is three in FIG. 30, the input terminal numbered 2 in FIG. 30 is assigned number 4.

In block 11, a table representing connection relationships between an input terminal and a gate and among gates as described in conjunction with FIGS. 31 and 34 is configured such that a list of numbers of fanout gates of input terminals and gates starts at addresses as numbers assigned to the input terminals and gates. For example, in FIGS. 31 to 34, data of address 1 indicates a pointer to a list of the numbers of a fanout gate to which the output signal of the input terminal 1 is applied, as described above. The portion of the list defining connection relationships starts at address 101. By making 4 the number of the input terminal numbered 2 in FIG. 30, the addresses 2 and 3 can be used for connections in the list. Thus, the addresses 1 to 3 can be used to represent the list the connections.

In FIG. 1B which is a functional block diagram of the second principle of the invention, in block 12, when there are a plurality of partial circuits having the same arrangement of the input terminal and gates in a circuit, a specific offset value is assigned to each other partial circuit using input terminal and gate numbers of one partial circuit as the reference, and each input terminal and gate is numbered by adding the offset value between corresponding input terminal and between corresponding gate.

In block 13, in a table representing connection relationships between an input terminal and a gate and between gates, the offset value assigned to each partial circuit is added to the list for the partial circuit used as the reference so that the list of numbers of fanout gates of input terminals and gates may be shared among the plural partial circuits.

When applying the second principle of the invention, but not the first principle, for example, gate numbers, which are 10 to 12 and 13 to 17 in FIG. 30, would be 4 to 6 and 7 to 11. Thus, pin and gate numbers 1 to 11 correspond to the partial circuit or macro used as the reference. In this example, input terminals numbered 4 to 6 would be assigned 21 to 23 and gates numbered 20 to 27 would be assigned numbers 24 to 31, which correspond to the numbers 10 to 17 of the reference macro. That is, the offset value for the second partial circuit relative to the partial circuit used as a reference circuit is 20. By relatively numbering input terminals and gates of each partial circuit using an offset value and preparing only one list of fanout gate numbers in the table representing connection relationships between an input terminal and a gate and between gates, a single list can be referred to for fanout gate numbers of gates of each partial circuit using an offset value.

Figure 2:
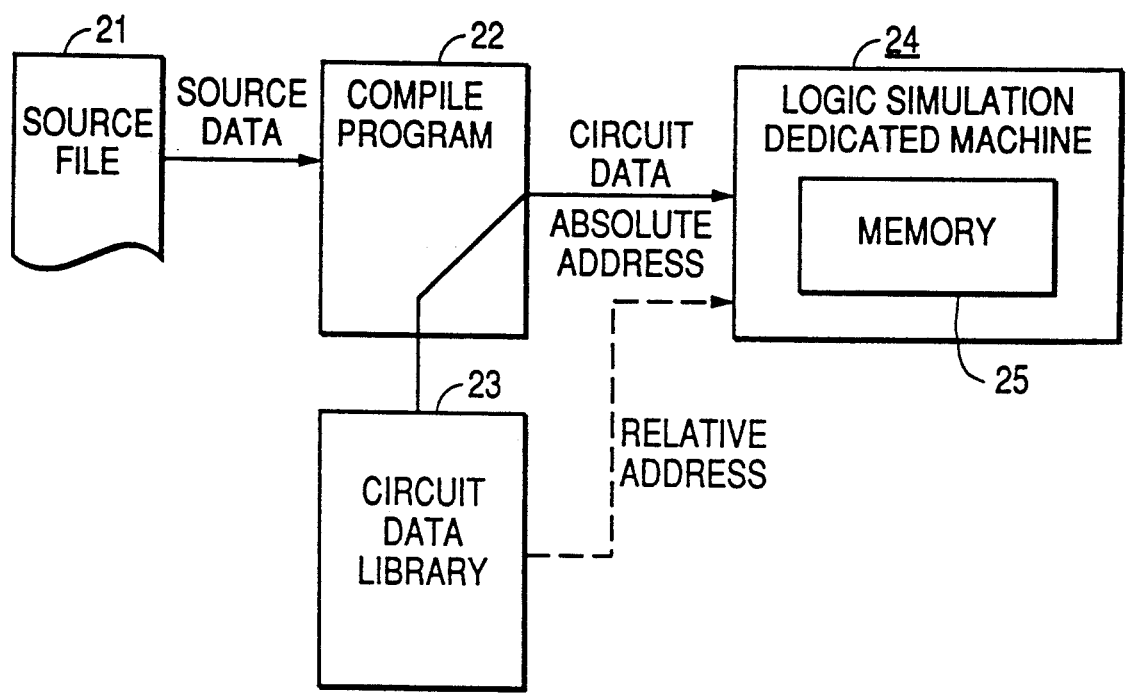
FIG. 2 is a block diagram illustrating the third principle of the present invention.

FIG. 2 is a block diagram illustrating the third principle of the present invention, which is directed to a circuit data expansion system in a memory 25 of a logic simulation dedicated machine 24 when a simulation circuit model is generated by compilation of source data.

In FIG. 2, a circuit data library 23 stores circuit data resulting from compilation of circuit components to which source data in a source file 21 refers. A compile program 22 has the facility to read source data from the source file 21, to take circuit data corresponding to the source data from the circuit data library 23 and to expand it in the memory 25 of the logic simulation dedicated machine 24. It also has the facility to issue a copy instruction to copy the circuit data which is already expanded on the memory 25 onto another location of the memory 25.

The compile program 22 sequentially reads source data from the source file 21, refers to the circuit data library 23 to take compiled circuit data and expands it in the memory 25. When the source data corresponds to the circuit data which is already expanded in the memory 25, the compile program 22 issues a copy instruction to copy this expanded circuit data without taking circuit data from the circuit data library 23 again.

In FIG. 2, when all of the circuit data comprise pieces of source data corresponding to plural modules or components and if compiled circuit data corresponding to a piece of source data have already been expanded in the memory 25, the data are copied. When circuit data for all of modules or components have been expanded in the memory 25, the connection relationships among modules or components are set, thereby generating simulation circuit data. Thus, by utilizing a hierarchical structure at the time of compilation of source data, circuit data for modules or circuit parts once expanded in the memory 25 are copied within the memory 25, thereby reducing the amount of processing.

Figure 3:
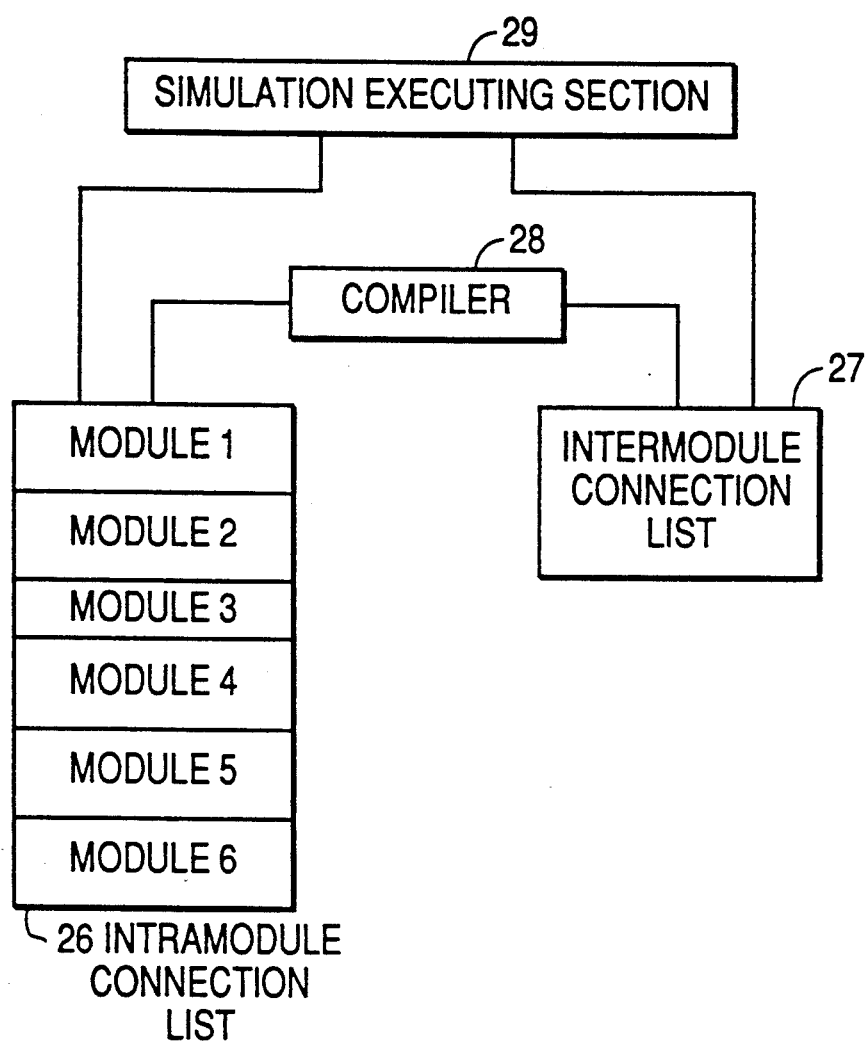
FIG. 3 is a block diagram illustrating the fourth principle of the invention.

FIG. 3 is a block diagram illustrating the fourth principle of the present invention, which is directed to an intermodule connection system for generating simulation circuit data or model by connection between modules.

In FIG. 3, an intramodule connection list 26 stores connection information for a gate within each module for each address uniquely assigned to gates and pins and is provided with an area for storing an address of an output pin connecting that module to another module. An intermodule connection list 27 has an area for storing an address of an input pin within the other module, which, is connected to the output pin whose address is stored in the area storing the output pin(s) of the intramodule connection list 26.

At the time of compilation by a compiler 28, the address of the output pin set in the above storage area of the intramodule connection list 26 and the address of the input pin of the module to which the output pin is to be connected is set in a storage area designated by the address of the output pin. Plural modules are connected to generate the entire simulation model and simulation is carried out by a simulation executing section 29.

If, for example, the address of the output pin of a certain module is 104, the address of a input pin of another module which is supplied with an output signal of the output pin is 28, and the output pin of address 104 is the output of the gate 1, the address 104 of the output pin is stored in that area of the intramodule connection area 26 whose connection to the output of the gate 1 is known, and the address 28 of the input pin is stored in that area of the intermodule connection list 27 which is designated by the address 104. Thus, the connection relationship between the output pin (address 104) to which the output of the gate 1 of a certain module is output and the input pin (address 28) of the other module is set.

Figure 4:
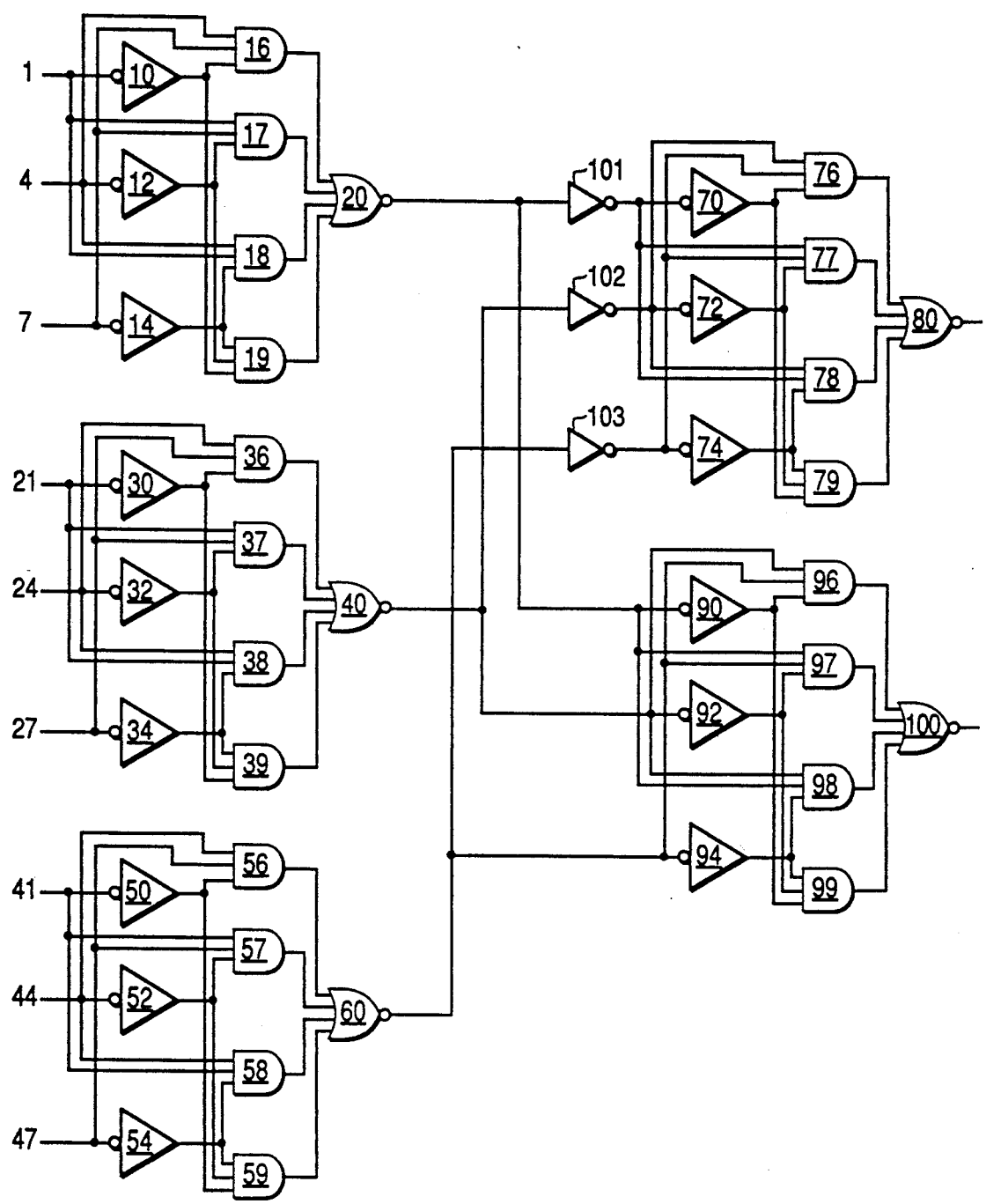
FIG. 4 illustrates an embodiment of a first gate addressing system.

FIG. 4 illustrates a first gate addressing system according to the first principle of the present invention. The numbering in the first gate addressing system is characterized in that, first, the relative relationships among gates in macros of the same structure are equal in respective macros and, second, gates are not consecutively numbered. For example, a first input pin has three fanouts and thus the next input pin is numbered in accordance with a rule such that $1+3=4$. Likewise, the twelfth gate has two fanouts and hence the next gate is numbered $12+2=14$.

According to the second principle, when the same macro is used in plural locations in a device, it is only required to repeatedly copy the same data into different addresses. For example, tables for macros assigned numbers 1 through 20, tables for macros assigned numbers 21 through 40 and tables for three other identical macros have only to store the same contents (thus resolving the second problem).

According to the first principle, each gate is not necessarily required to point to a list of connections and a connection list can immediately follow a gate address. Therefore, the number of addresses i.e., $(1+F)$ times the number of gates in the conventional system may be reduced to F times the number of gates (thus resolving the third problem).

FIGS. 5, 6 and 7 illustrate a table of connection relationships corresponding to the first gate addressing system of FIG. 4. Compared with the conventional data structure of the table of FIGS. 31 to 34, a further column "ADD" is added between columns "PTR" and "GATE". In this embodiment, when ADD=1, the GATE column is numbered such that the sum of an address number and a number written in the GATE column indicates the actual gate number. When ADD=0, the GATE points to a gate number directly as in the conventional system.

To obtain fanouts of the gate 10, the table address 10 is referred, to. Since the END at address 10 is 0, but at address 11 is 1, there are two connections from the gate at the address 10. Since ADD=1 at the address 10, a gate number of 16 is obtained by adding +6 in GATE to the address 10. Likewise, the address 11 and GATE=+8 results in a gate number of 19. By relatively expressing the connections relationship for address 1 through 20 as described above, if a small-scale circuit at a macro level is once compiled, the resultant data can be utilized as it is, without renumbering gates uniquely as a whole (thus resolving the first problem). Such a relative description feature is used in the above numbering method.

Figure 8A:
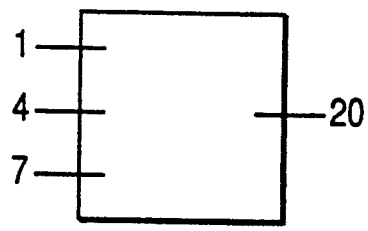
FIGS. 8A and 8B are diagrams for explaining the macro and hierarchical representation of FIG. 4.
Figure 8B:
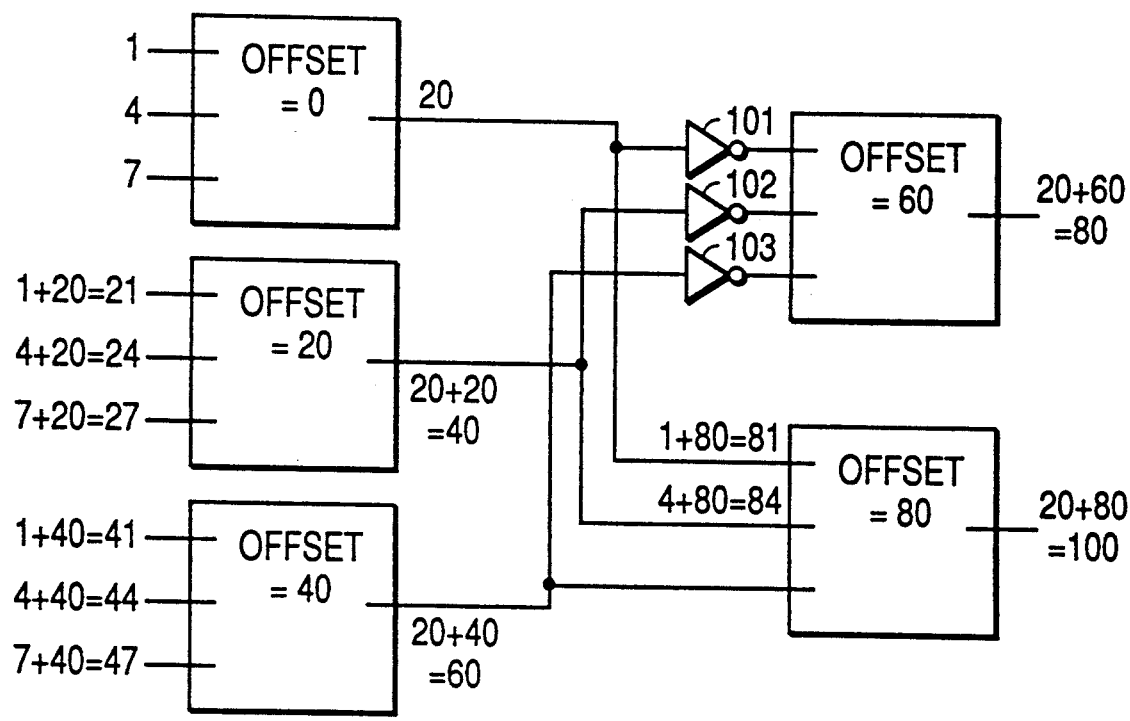

FIGS. 8A and 8B are diagrams for explaining the macro and hierarchical representation of FIG. 4. The circuit of FIG. 4 is designed hierarchically as shown in FIGS. 8A and 8B. The macro data shown in FIG. 8A and its connection relationships are described normally. At this point it is only necessary to set an offset value to each of the macros using the present gate numbering method. The offset values have only to be set so that gate numbers of each macro may not coincide with those of another macro. Since each macro is designed herein to have a size of 19, the offset interval is set to 20. In this way, internal data of the macro can be utilized as it is, thus eliminating the need for renumbering gates (thus resolving the first problem). Where macros of the same type are used, as in the present embodiment, the macro need be copied only a few times. For connection among macros, the connections of those having offset values 0, 20 and 40 are respectively defined at the addresses 200 et seq., 210 et seq. and 220 et seq. or the table in FIGS. 5 to 7. This is based on the adoption of an indirect addressing method (pointer). In this way the data structure of FIGS. 5 to 7 can be generated at a higher speed than with the conventional system.

The first feature of the gate addressing system described in conjunction with FIGS. 4 to 8 and the corresponding table data structure is that the connection relationships within a macro are represented by relative values to data storage addresses, thus making data for a plurality of macros basically equal. For example, data for addresses 1 to 19 may be equal to those for addresses 21 to 39, 41 to 59, 61 to 79 and 81 to 99.

The second feature is that the output of the entire macro is expressed by a list pointed to by a pointer. Thus, only one address suffices for one output, the size of a table required for a macro becomes constant regardless of how the output of the macro is connected outside and the address assignment to each macro can be performed independently, at high speed. In FIG. 4, the output gates of the macros are 20, 40 and so on.

The third feature is that gate addresses are not consecutive and included is an embedded list of fanout gates, thus reducing the number of pointers. For this reason, the total number of addresses in the system of FIGS. 5 to 7 is 110, while in the conventional system of FIGS. 31 to 34 it is 141.

Figure 9:
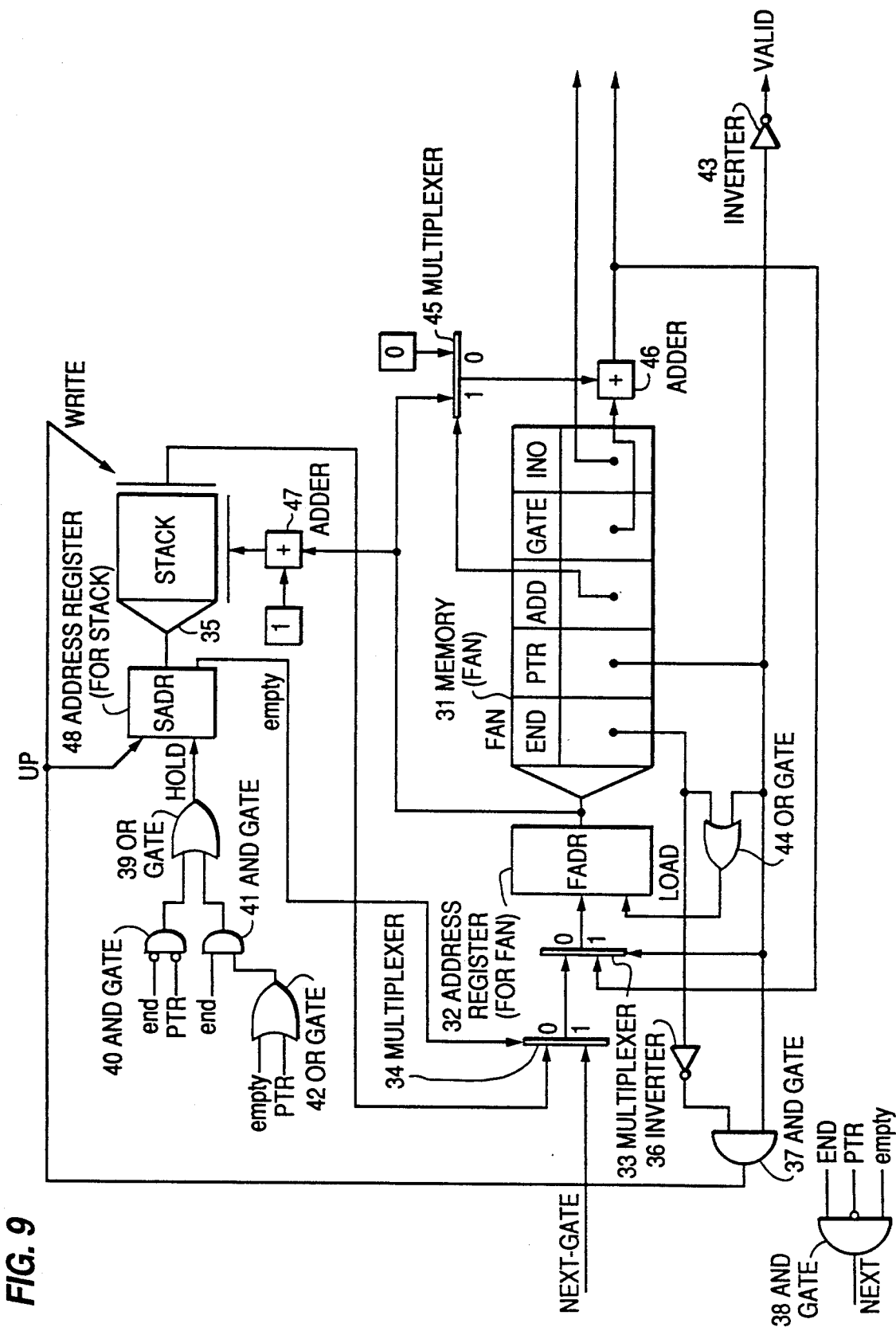
FIG. 9 is a block diagram of a first connection relationship outputting hardware corresponding to the first gate addressing system.
Figure 35:
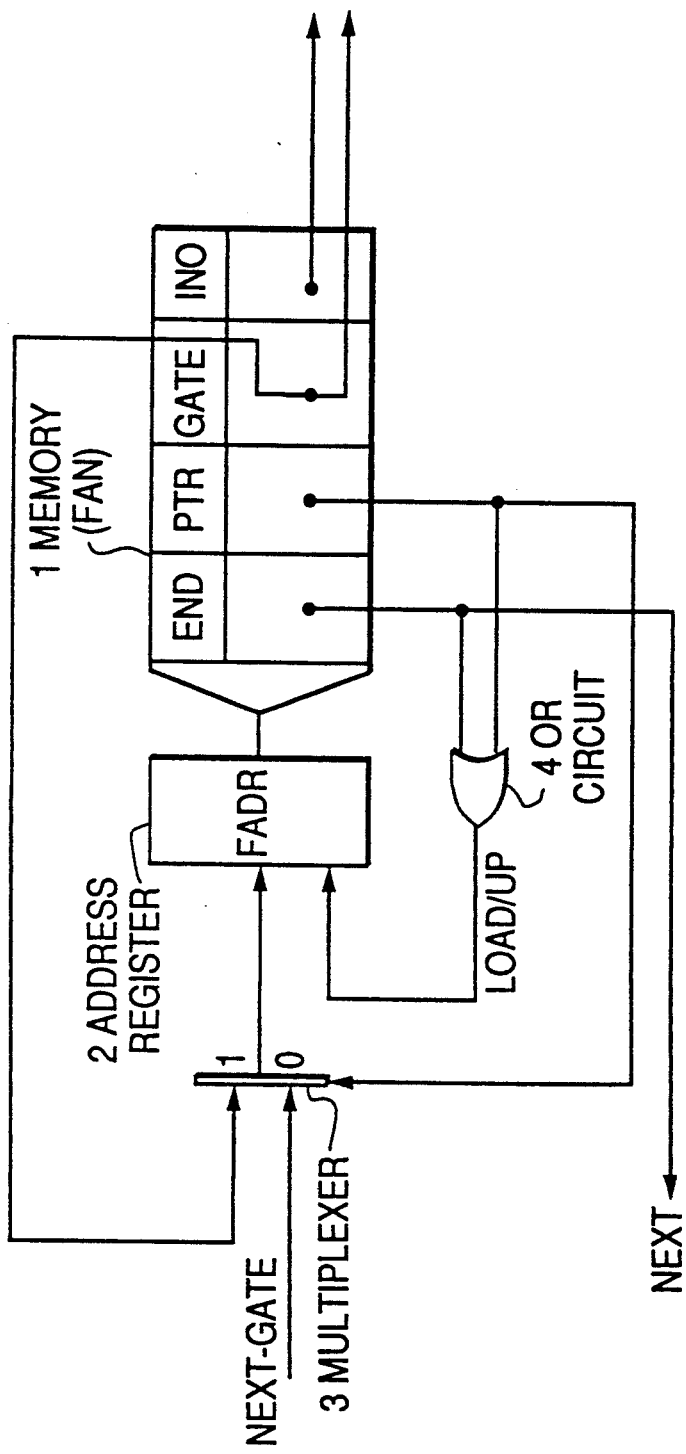
FIG. 35 illustrates an example of a connection relationship outputting hardware corresponding to the conventional gate addressing system.

FIG. 9 illustrates an example of connection relationship outputting hardware corresponding to the first gate addressing system. Block 31 denotes a memory (FAN) for storing connection relationship display table data as in the conventional system of FIG. 35. Block 32 denotes a register (FADR) for pointing to an address of the table. This register 32 loads data from a multiplexer 33 (when load=1) or increments the current address by one (when load=0). This is controlled by a signal line load. When data in the FAN is a pointer (PTR=1), the multiplexer 33 passes data coming from the FAN 31. A multiplexer 34 selectively loads externally applied data "next-gate" or data from a stack 35 and passes data from the stack as long as the stack is not empty (empty=1). Gates 36 to 44 are control gates. A multiplexer 45 and an adder 46 pass data GATE from the FAN 31 as is or with a table address added. The multiplexer 45 passes zero to be added to the data GATE when ADD=0 and the table address to be added to the data GATE when ADD=1. Block 35 denotes a stack which, when data in the table FAN is a pointer (PTR=1), stores an address (the current FADR address+1 from an adder 47) which is used at the termination of reading of data pointed to by the pointer. If, however, the pointer is written at the end (END=1) of a list, the address is not saved since it does not need to return. 48 is a register which controls an address SADR of the stack. When a return address is saved, the address is incremented by one (UP=1) to write data. When a table list ends, UP becomes UP=0, in which case the value of the SADR 48 is decremented by one after the contents of the stack 35 have been read into the FADR 32. When the list is incomplete (END=0), the SADR value is incremented only when data is for a pointer. At the end of the list, the SADR value is usually decremented (UP=0). When the stack is empty (empty=0) or data is for a pointer, the SADR 48 does not operate.

First, the condition under which external data "next-gate" is taken in will be described. Only when the stack 35 of the hardware is empty, a list which is being internally read ends (end=1) and the last piece of data is not a pointer (PTR=0), AND gate 38 is enabled to take in the next gate next-gate which is a candidate for taking out fanout gates from the next gate. In other cases, external circuits are on standby while data are being stored.

When the above condition is satisfied, the next-gate is loaded into the FADR 32 via the multiplexers 34 and 33. A gate number is thereby set in the FADR so that reading of fanout gates from the table 31 is initiated. When data is not a pointer, a valid signal from the inverter 43 goes to 1, indicating that effective data are being output to the outside. With regard to the gate number, the current FADR address is added to GATE when ADD=1 so that a relative address is translated to a direct gate number.

When data is a pointer, a pointer value is set in the FADR 32 via the multiplexer 33 to read a list pointed to by the pointer. At this point, it is the current FADR value+1 that is to be returned at the termination of a reading of a preceding list and this value is stored in the stack 35. This is carried out by incrementing the FADR by one and writing FADR+1 into the stack 35. However, when the pointer data is the last data in the list, it is not stored because a return is not necessary.

When the last piece of data in a list is read, if the last piece of data is a pointer, the next list pointed to by the pointer is read. If the last piece of data in the current list is not a pointer, processing is returned to the preceding list from which the current list was pointed. The address of the preceding list is written in the stack. This address is taken into the FADR via the multiplexers 34 and 33 and the SADR value is decremented by one.

By repeating such an operation, the readout of fanout gates is terminated. Thus, the stack 35 becomes empty, the end of the list is reached and the last piece of data on it is no longer a pointer.

Figure 10:
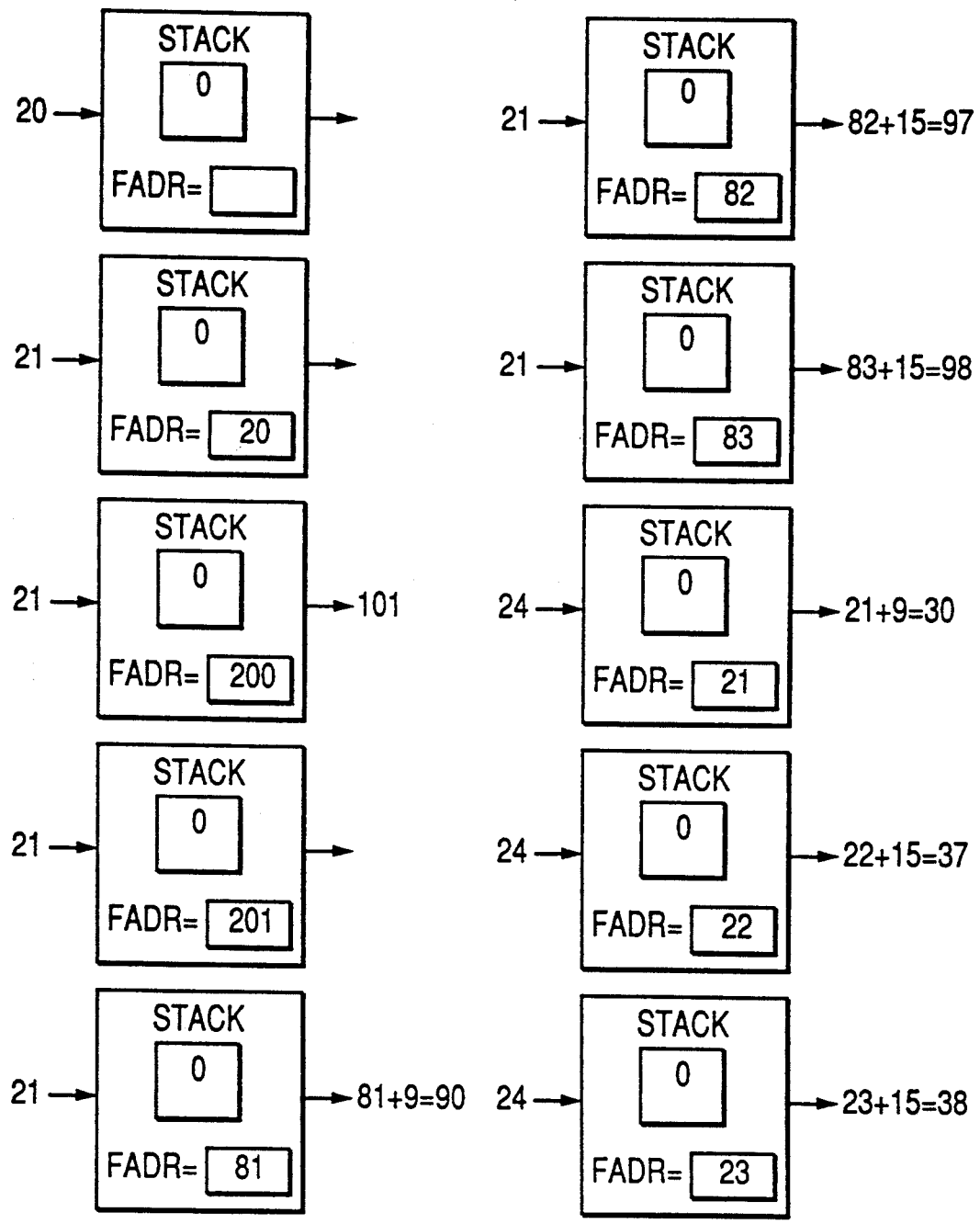
FIG. 10 is a diagram illustrating an operation of the hardware of FIG. 9.

FIG. 10 illustrates an example of an operation of the hardware of FIG. 9. An operation of the hardware in which 20, 21 and 24 are continuously input from outside as next gate numbers is indicated by the contents of the address register (FADR) 32 and stack 35. When 20 is externally input as the next gate number, no fanout gate number is output, the contents of the FADR becomes 20 and the next gate number becomes 21 because the data in the address 20 in FIG. 8 indicates END=1, PTR=1 and ADD=0. At this time the contents of the stack remain 0. The contents of the address 20 indicate a pointer value of 200 by which the contents in address 200 are referred to. That is, the FADR value becomes 200 and the contents of GATE in address 200 is output as a fanout gate number. Since END=0 and PTR=0 in address 200, the FADR value is increased to 201.

In address 201, END and PTR are both 1s so that no fanout gate number is output and address 81 is stored in the FADR 32 in accordance with pointer value 81. In address 81, the ADD is 1 and the END and PTR are both 0s. Thus, the address 81 and the contents of the GATE, i.e., +9, are added together and 90 is output as a fanout gate number. Likewise, 97 and 98 are output as fanout gate numbers for addresses 82 and 83.

In address 83, the END is 1 so that the fanout gate number list for gate number 20 ends and the next gate number 21 is taken into the FADR 32. The content of address 21 corresponds not to a pointer but to a fanout gate number. Since ADD=1, the address 21 and the contents of GATE, i.e., +9, are added together so that fanout gate number 30 is output. The fanout gate list for the gate numbered 21 continues up to address 23, in which the END becomes 1 so that fanout gate numbers 37 and 38 for addresses 22 and 23 are read. In this example, a pointer is always placed at the end of a list and thus no data is stored in the stack.

Figure 11:
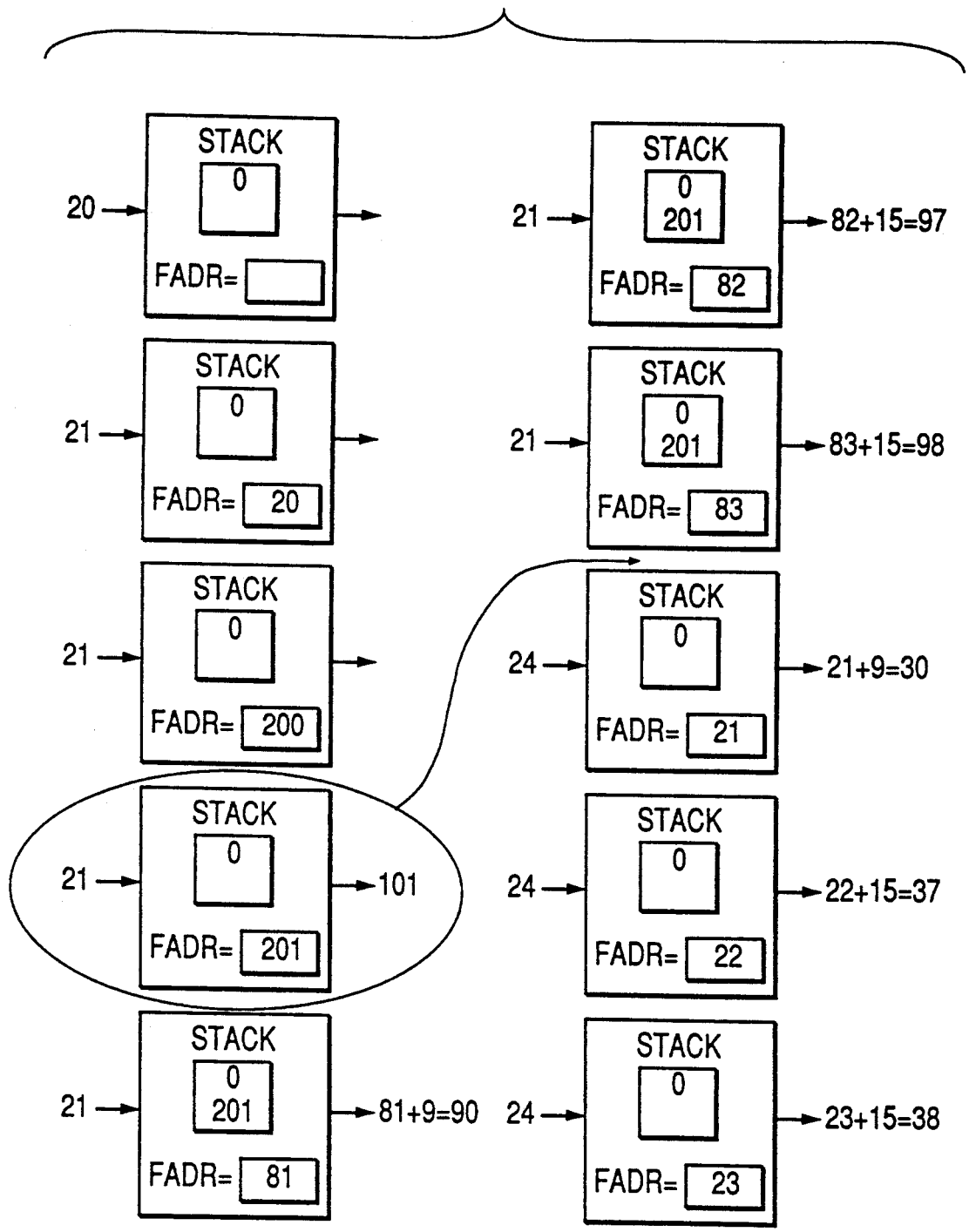
FIG. 11 is a diagram illustrating another operation of the hardware of FIG. 9.

FIG. 11 illustrates another example of the operation of the hardware of FIG. 9. In this example, data, except the contents of the END field are interchanged between addresses 200 and 201 in the table of FIG. 7. That is, in the table of FIG. 7, the PTR and GATE in address 200 are changed to 1 and 81, respectively, while the PTR and GATE in address 201 are changed to 0 and 101, respectively.

In FIG. 11, the operation is the same as that in FIG. 10 until gate number 20 is stored in the address register 32 (FADR). However, since data in address 200 pointed to by the pointer value as data in address 20 is a pointer, no fanout gate number is output when 200 is stored in the FADR 32, the contents of the FADR becomes 81 at the next clock, return address 201 is stored in the stack at the end of the list pointed to by the pointer, and fanout gate number 90 is output using data in address 81. Subsequently, fanout gate numbers 97 and 98 are output as in FIG. 10, the value of the FADR 32 becomes address 201 stored in the stack because the list ends at address 83 and fanout gate number 101 is output. The reading of the fanout gate list for the gate numbered 20 ends at address 201. Fanout gate numbers for the gate numbered 21 are read afterward as in FIG. 10.

In the embodiment described in conjunction with FIGS. 4 through 11, the inputting of the next-gate is placed in the wait state when effective data is output to the outside. In this case, however, the writing into and reading from the stack are unnecessary and hence it is logically possible to input the next-gate into the stack early. The implementation of such hardware is also possible.

The technique may be applied to generation of a data structure of a simulator serving as software and not as a dedicated machine. In this case, where an existing simulator adapted for direct addressing of gates is used, it is necessary in loading circuit data into the simulator to translate relative addresses to direct addresses. To cope with indirect addresses, a non-delay buffer can be inserted into a circuit. In this case, the buffer is assigned a gate number which can be pointed to by a pointer. This also applies to the case where the compile method is applied to a conventional simulation dedicated machine.

Figure 12:
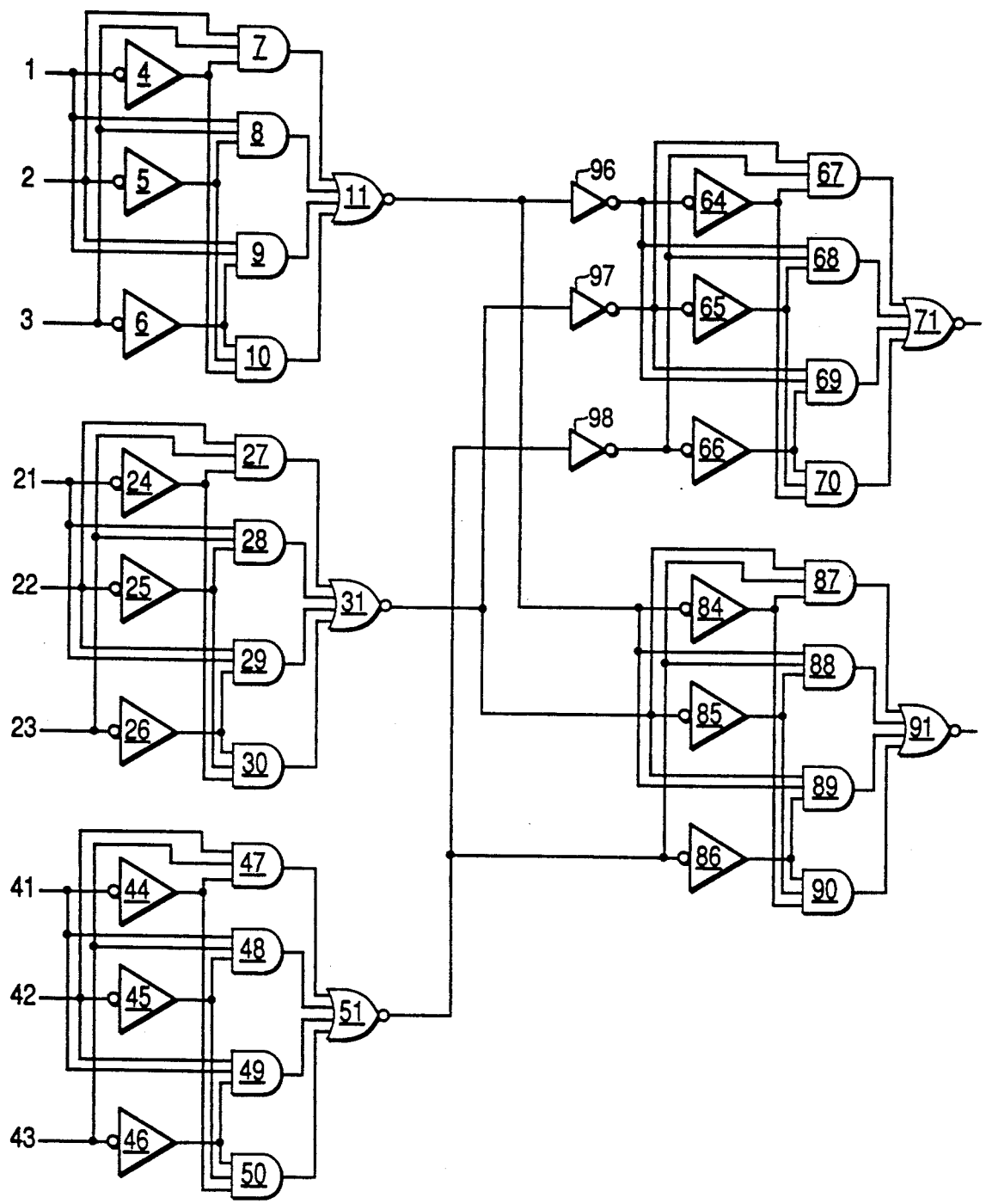
FIG. 12 illustrates a second gate addressing system.

FIG. 12 illustrates a second gate addressing system according to the second principle. The feature of gate numbering is that relative relationships among gates in identical macros are equal in respective macros. Gates numbered 1 to 11 and gates numbered 21 to 31 are the same macro. The relative relationship (difference between gate numbers) between corresponding gates is equal for any gate.

FIGS. 13 and 14 illustrate a second connection relationship indicating table corresponding to the second gate addressing system. Compared with the conventional table of FIGS. 31 to 34, a further column "ADD" is added between columns "PTR" and "GATE", as for the table of FIGS. 5 to 7. The meaning is the same as that of FIGS. 5 to 7.

The INO column, unlike in the conventional system, indicates an offset value when PTR=1. The GATE column indicates a pointer value when PTR=1, as in the conventional system. When PTR=1, a jump is made to a destination pointed to by a pointer value in the GATE column, as in the conventional system. Unlike in the conventional system, a fanout gate number contains an offset value of GATE data pointed to by a pointer. If the offset value and ADD are always 0, the second system is the same as the conventional system.

When the same macro is used in plural locations, the use of the addressing system of FIG. 12 and the data structure of the table of FIGS. 13 and 14 eliminates the need to repeatedly copy the same data into different addresses. The data has to be held in only one address. The pointer offset values permit independent gate numbers to be generated. For example, the pointer of the gate numbered 96 and the pointer in address 201 in the list of the fanout gate numbered 11 both point to 100, but different offset values of 60 and 80 are written in the BASE 2. Offset value 60 points to 64, 68 and 69 in the same macro, while offset value 80 points to 84, 88 and 89 (thus resolving the second problem).

In a circuit using the same macro repeatedly, therefore, the table has only to store one type of macro. Thus, the length of the list can be reduced according to the frequency of repetition of the macro (thus resolving the third problem).

In FIGS. 13 and 1 4, table address 11 is referred to in order to obtain fanouts of the gate numbered 11. The address 11 points to address 200 with offset value 0. Since the END of address 201 is 1, there are two entries in the list starting at address 200. Since PTR=0 and ADD=0 in address 200, a gate number 96 is directly written in GATE. In address 201, PTR=1, to indicate a pointer, and the offset value is 80. Since the previous offset value is 0, an addition is made so that the correct offset value becomes 80. Since the pointer points to 100, a jump is made to 100 so that data are read from addresses 100, 101 and 102. In each of the addresses, ADD=1. Thus, gates numbered 84, 88 and 89, which are derived from table address+BASE 1+offset value (=80), are obtained as fanout gates. In this way, the table can express one type of macro using one address, thus reducing the quantity of data (thus resolving the first problem). If a macro is once compiled, its data can be utilized unchanged without the need to renumber gates uniquely as a whole (thus resolving the first problem).

Figure 15A:
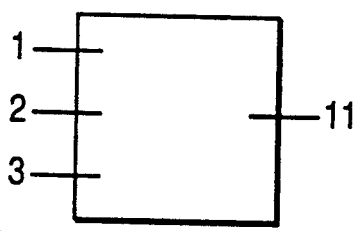
FIGS. 15A and 15B are diagrams for explaining the macro and hierarchical representation in FIG. 12.
Figure 15B:
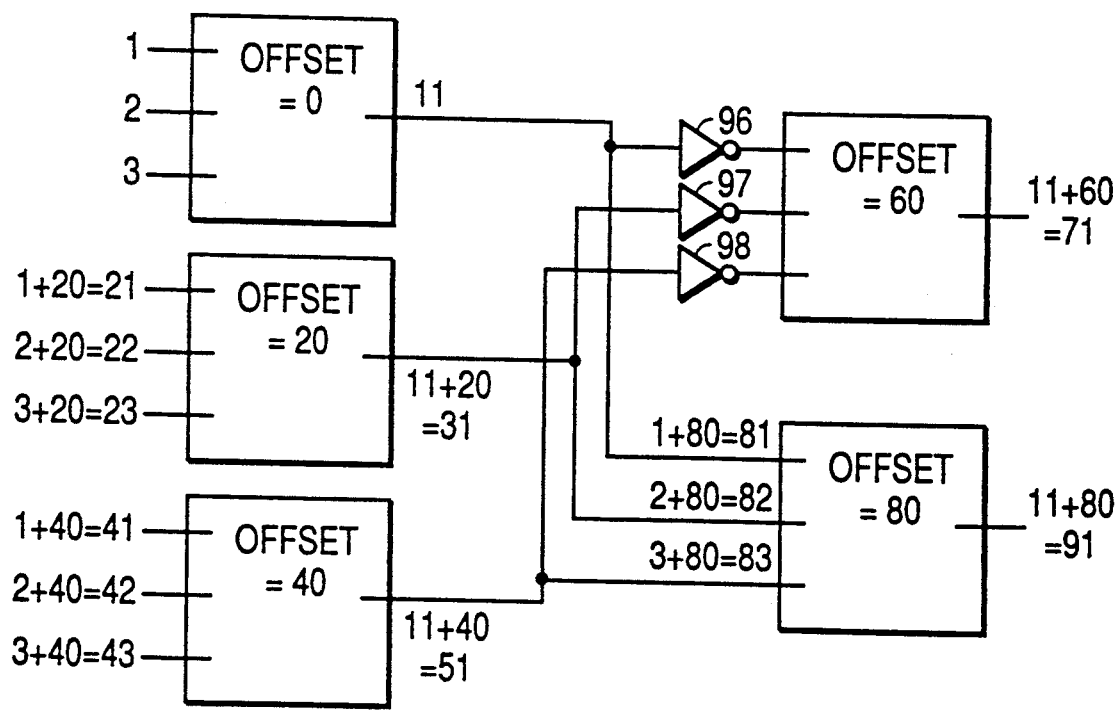

FIGS. 15A and 15B are diagrams for explaining a macro of FIG. 12 and hierarchical representation. The circuit of FIG. 12 is designed hierarchically as illustrated in FIGS. 15A and 15B. Macro data, illustrated schematically in FIG. 15A and its connection relationship illustrated in FIG. 15B are normally described. In this case, by using the present gate numbering method, a table has to have only one address pointing to addresses of gates within a macro for each subsequent occurrence of the macro. An offset value for identifying a macro has only to be set in BASE 2 of a row which points to the macro. Offset values for macros may be set such that their gate numbers do not coincide. Since the size of the macro in this example is 11, the offset interval is set to 20. The offset interval may be 12, but this value makes the correlation of numbers difficult to understand. Thus, 20 is used herein. This allows the internal data of a macro to be used unchanged, thus eliminating the need to renumber gates (thus resolving the first problem). Where macros of the same type are used, as in the present example, it is unnecessary to copy the macro several times. To enable interconnection of macros, their connections are defined individually in addresses 200, 202 and 204. This depends on the adoption of the indirect addressing method (pointer). Thus, the data structure of FIGS. 13 and 14 can be generated at a higher speed than in the conventional system.

Figure 16:
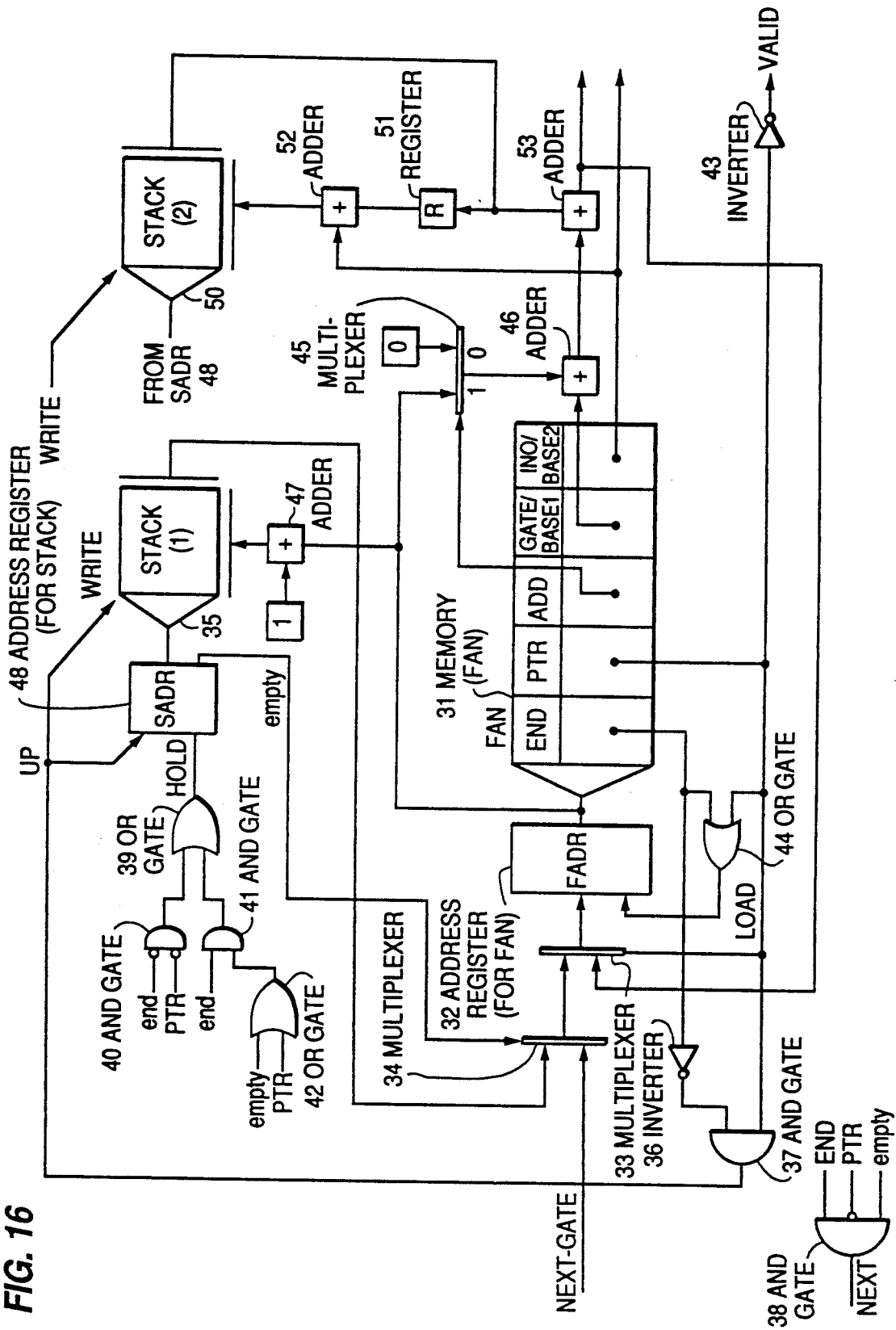
FIG. 16 is a block diagram of a second connection relationship outputting hardware corresponding to the second gate addressing system.

FIG. 16 is a block diagram of connection relationship outputting hardware corresponding to the second gate addressing system. Like reference characters are used to designate parts corresponding to those in FIG. 9 for the first gate addressing system and their descriptions are omitted.

The stack (2) 50 of FIG. 16 operates in the same manner as the stack 35. Data to be stored in the stack 50 is data of BASE 2. Initially the contents of a register 51 are 0 and thus the value of BASE 2 is stored in the stack (2) 50 as it is via an adder 52. This corresponds to a first pointer when a list is traced. This offset value is stored in the stack (2) 50 and output from the stack (2) 50 at the next clock for addition in an adder 53. When a pointer comes again in this state, the value of BASE 2 is added to the current offset value in the adder 52 and then stored in the stack (2). The register 51 holds the offset value output from the stack one clock before. The stack (2) 50 outputs 0 when no data is stored therein and clears the register 51.

In the stack 50 are written offset values. At a first-stage pointer the stack (2) is empty so it outputs data 0, making the value in the register 51 0. Thus, data written in BASE 2 becomes an offset value as is. Furthermore, when a pointer is followed, the sum of data written in BASE 2 and the current offset value output from the stack 50 and stored in the register 51 becomes the formal offset value and is stored in the stack 50. The address register for the stack (2) is SADR 48, which is also the address register for the stack 35.

In the second gate addressing system described in conjunction with FIGS. 12 to 15, conditions such as those described in conjunction with FIG. 16 in which a second pointer is written in a list pointed to by a first pointer, that is, conditions in which the value of BASE 2 is added to the current offset value, do not occur. Such conditions occur when the depth of hierarchy is three or more. They will be described conceptually with reference to FIGS. 17A and 17B.

Figure 17A:
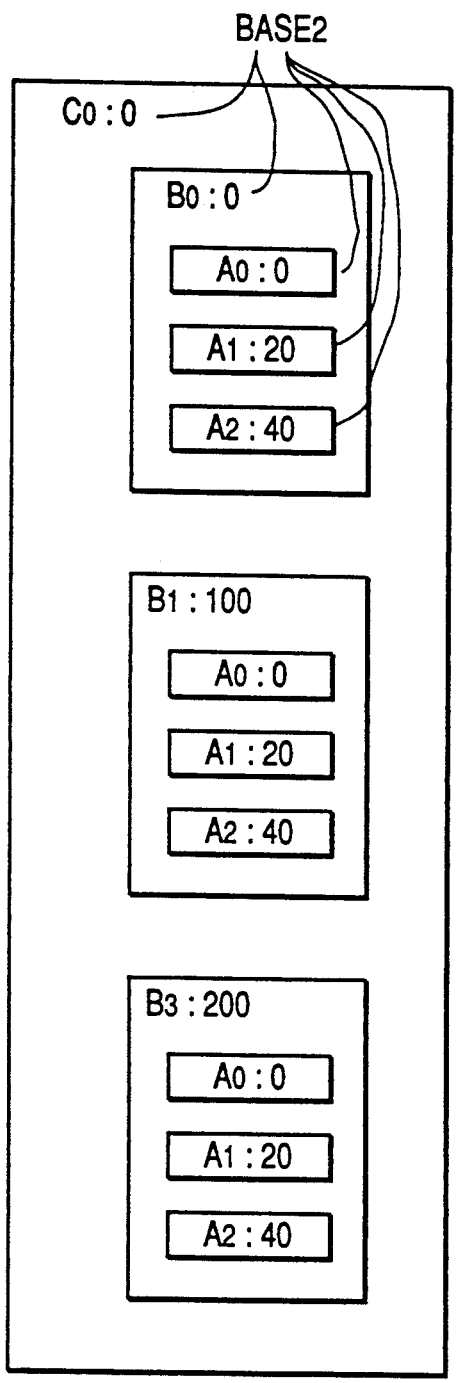
FIGS. 17A and 17B are diagrams for explaining the concept of the gate addressing system when the depth of the hierarchy is 3 with FIG. 17A for design hierarchy and with 17B for the gate address space.

FIG. 17A illustrates an example of three hierarchies. Macros, i.e., partial circuits B0, B1 and B2, are the same as each other. In the second gate addressing system, only data on macro B0 is generated and addresses for macros B1 and B2 are generated on the basis of data in macro B0 by providing an offset BASE 2. The offset is set to 100 for macro B1 and to 200 for macro B2. That is, macro B0 does not have more than 100 entries. Macros A0, A1 and A2 in the macro B0 are also the same as each other. As is the case with the macro B0, addresses are generated on the basis of data on A0 by providing each of macros A1 and A2 with an offset BASE 2.

Figure 17B:
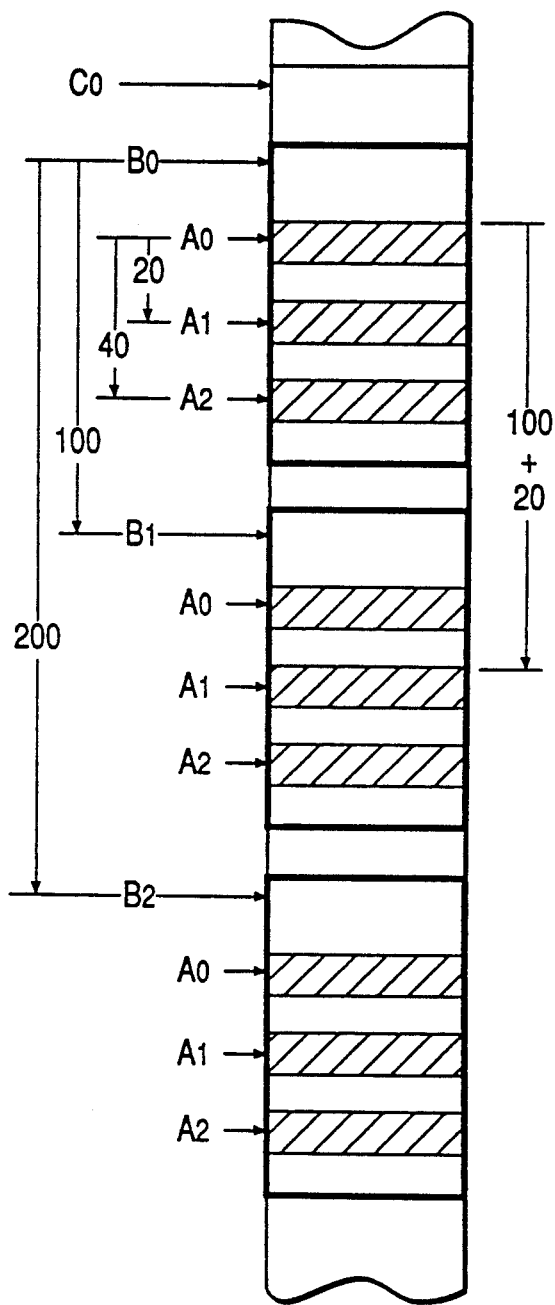

FIG. 17B illustrates addresses which are finally generated in the gate address space. For example, a gate number, i.e., an address of macro B1, is obtained by adding 100 to the address of the corresponding gate in macro B0. An address of macro A1 within macro B1 is obtained by adding 100+20 to the address of the corresponding gate in macro A0 of macro B0. Thus, it becomes necessary to add two BASE 2s together.

A correspondence between the description of FIG. 16 and the example of FIGS. 17A and 17B will be established as follows. The above-described first pointer corresponds to the case where an inside gate of macro B1 is pointed to from outside, that is, the case where a fanout of a gate external to macro B1 is connected to an inside gate of macro B1. The next pointer corresponds to the case where an inside gate of macro A1 is pointed to by a gate external to macro A1. The above-described current offset value corresponds, in this case, to 100 and the value of BASE 2 corresponds to 20.

Figure 18:
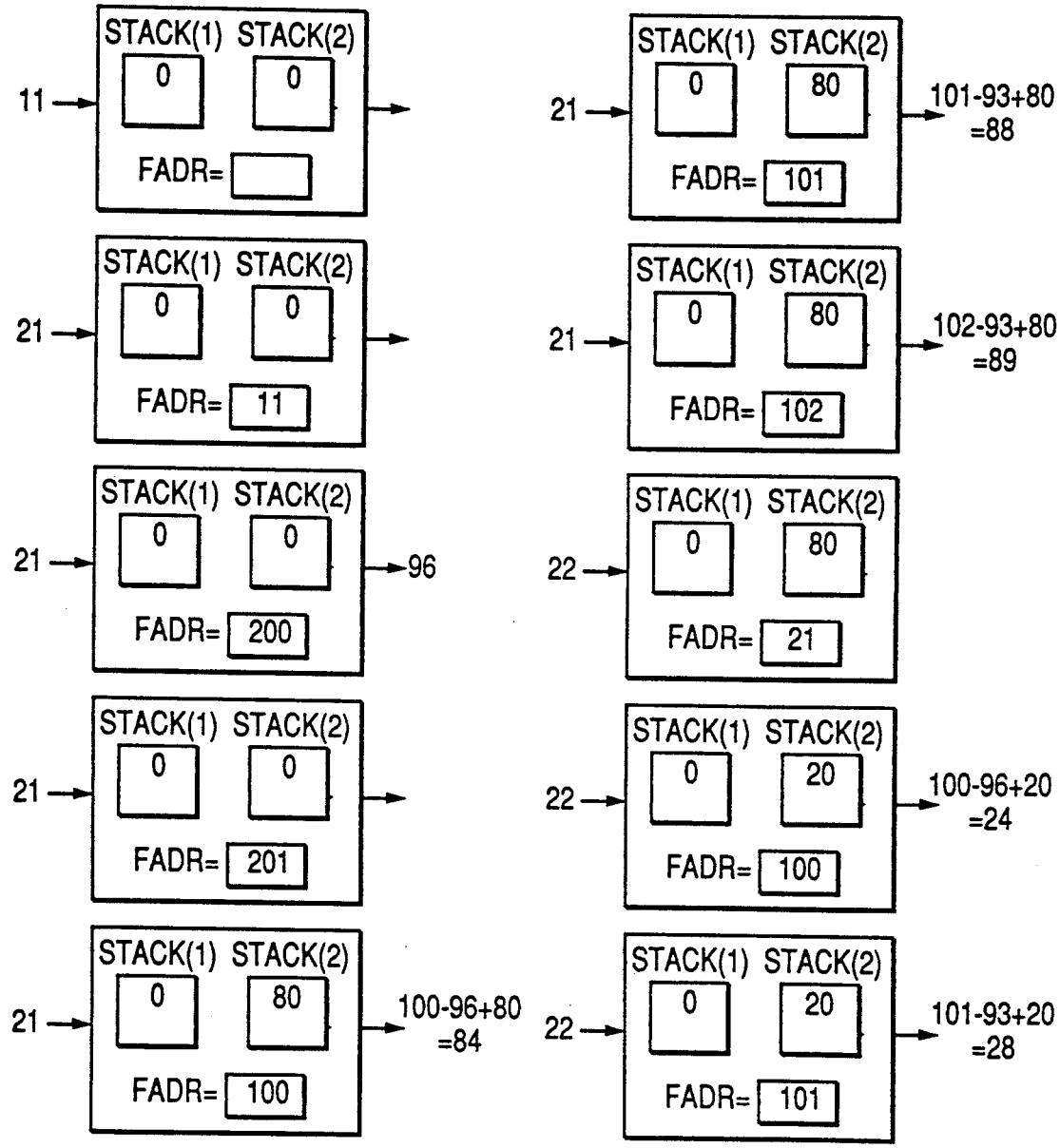
FIG. 18 is a diagram illustrating an operation of the hardware of FIG. 16.

FIG. 18 illustrates an example of operation of the hardware of FIG. 16. In FIG. 18, an operation in which 11, 21 and 22 are continuously input from outside as next gate numbers is illustrated with respect to the contents of the address register 32 (FADR) and two stacks 35 and 50. When 11 is input from outside as the next gate number, no fanout gate number is output, the contents of the FADR 32 becomes 11 and the next gate number becomes 21 since data in address 11 in FIGS. 13 and 14 is a pointer. At this time the contents of the two stacks remain 0.

Next, address 200 is pointed to by the contents in address 11 so that the value of the FADR 32 becomes 200 and gate number 96 is output. At this point the contents of the FADR 32 are incremented to 201. However, address 201 is the end of a list and stores a pointer value so that no fanout gate number is output.

Address 100 is referred to by the pointer value in address 201. At this time, the offset value 80 in address 201 is stored in the second stack 50. Then, 84 is output as a fanout gate number. Subsequently, fanout gate numbers 88 and 89 are output until address 102 is reached.

Thus, the outputting of fanout gate numbers for the gate 11 terminates. Next, the next gate number 21 is read into the FADR 32. The data in address 21 is a pointer value 100 and an offset value is 20. Thus, the FADR 32 becomes 100 and the second stack 50 becomes 20 so that a fanout gate number 24 for address 100 is output and fanout gate numbers for addresses succeeding address 100 continue to be output.

Figure 19:
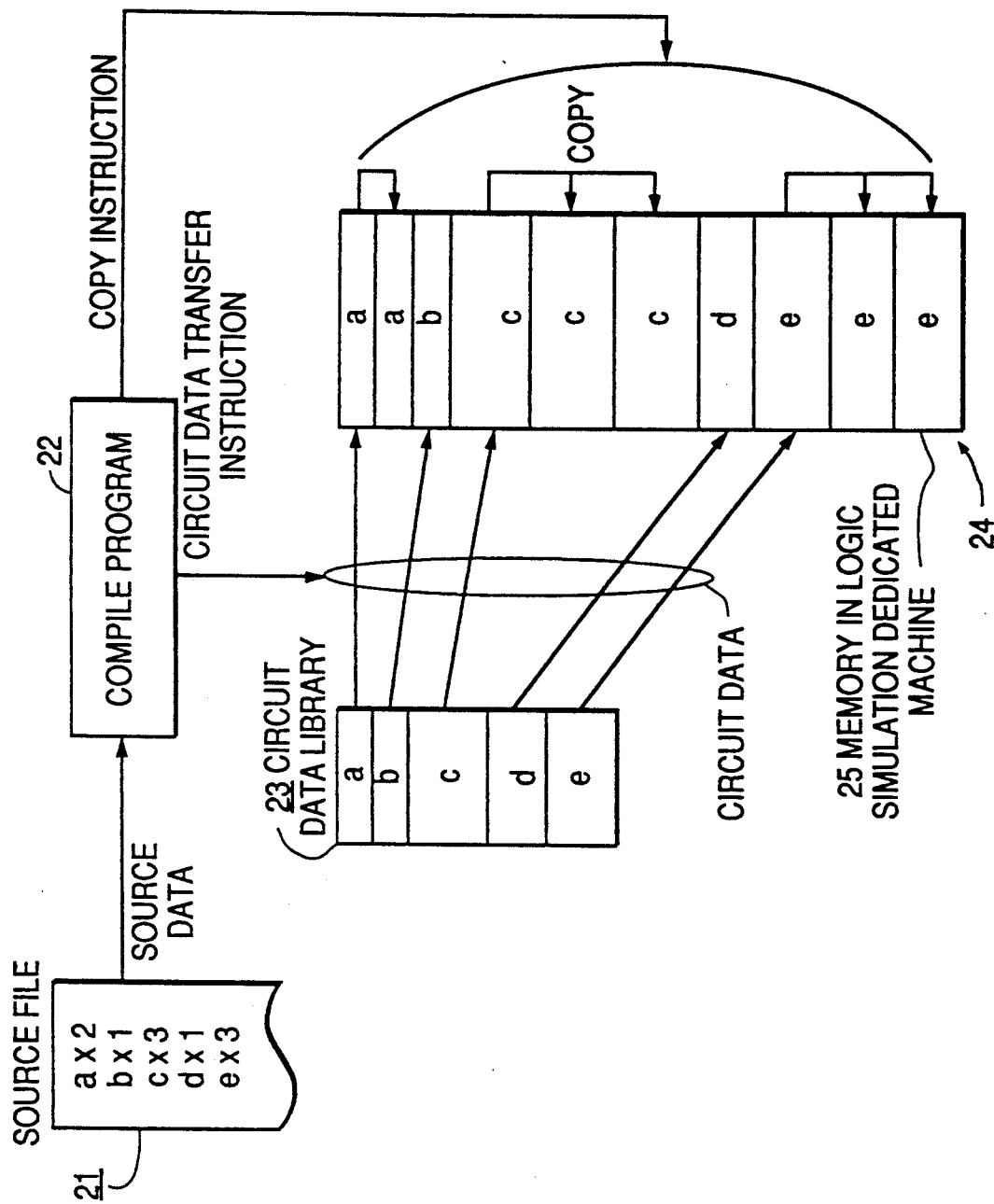
FIG. 19 is a block diagram of a circuit data expanding system.

Next, an embodiment of a circuit data expansion system in accordance with the third principle of the present invention, which is illustrated in FIG. 2, is illustrated in FIG. 19. In FIG. 19, a source file 21 stores source data which describes the structure of a circuit to be simulated. The source file 21 contains connection relationships among pins of the circuit (circuit components), etc.

A compile program 22 reads source data from the source file 21 in sequence, takes relevant circuit data from a circuit data library 23 for translation from a relative address to an absolute address and expansion in a memory 25, transfers relevant circuit data from the circuit data library 23 directly to a simulation dedicated machine 24 with a relative address, expands the data in the memory 25 after translation to an absolute address (when a relative address to absolute address translation facility is installed), and issues a copy instruction to copy circuit data expanded in the memory 25.

The circuit data library 23 previously stores circuit data resulting from compilation of circuit components to which source data refers. This circuit data library 23 stores in advance compiled circuit data, memory capacity for circuit data and so on.

The logic simulation dedicated machine 24 is adapted for high-speed logic simulation (computer system).

The memory 25 is installed in the logic simulation dedicated machine 24 and adapted to expand circuit data for simulation execution.

Next, the operation of the embodiment of FIG. 19 will be described with reference to the flowchart of FIG. 20.

In FIG. 19, it is assumed that the source file 21 stores source data for two components a, one component b, three components c, one component d and three components e. The circuit data library 23 stores circuit data a, circuit data b, circuit data c, circuit data d and circuit data e resulting from compilation of component a, component b, component c, component d and component e, and memory sizes for those circuit data (a memory size is represented in FIG. 19 by the size of a rectangle).

Figure 20:
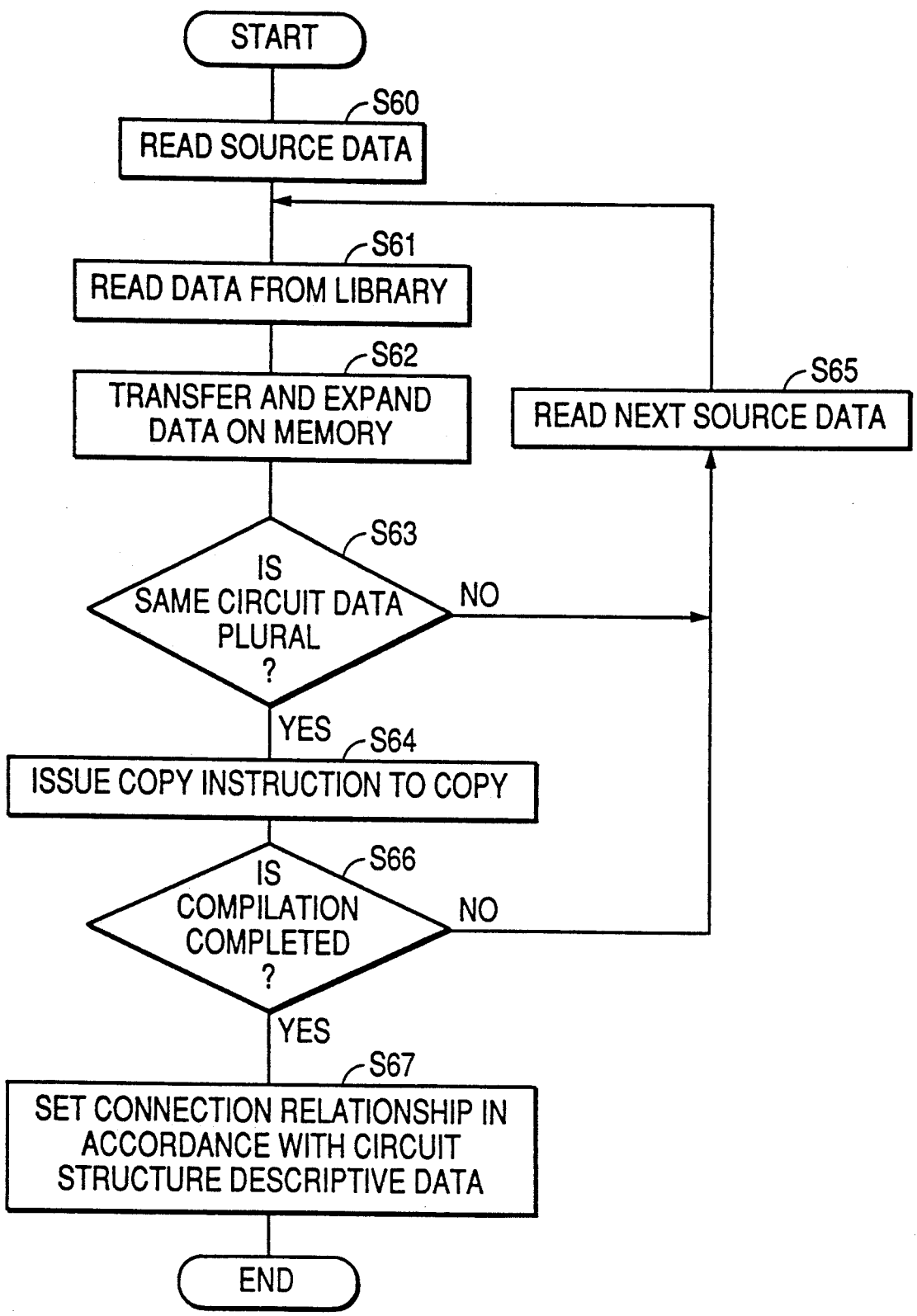
FIG. 20 is a flowchart of a compile process.

In FIG. 20, source data are read in step S60. That is, source data (for example, a×2) are read from the source file 21 on a row-by-row basis.

In S61, relevant data (for example, circuit data a) are read from the circuit data library 23.

In S62, the relevant circuit data are transferred and expanded in the memory 25. That is, the compile program 22 issues a circuit data transfer instruction so as to transfer circuit data (for example, circuit data a) from circuit data library 23 to the logic simulation dedicated machine memory 25, as indicated by an arrow in FIG. 19, and expands it in the memory.

In S63, a determination is made as to whether or not the same data is plural. If YES (for example, when the first source data a×2 is read from the source file 21), the process of S64 is performed. If NO, next data are read in S65 and the process returns to S61.

In S64, a copy instruction is issued to copy circuit data. That is, since it has been determined in step S63 that the same data is plural, the circuit data (for example, circuit data a) expanded in the logic simulation dedicated machine memory 25 is copied the relevant number of times.

In S66, a determination is made as to whether or not the compilation has been terminated, that is, whether or not all pieces of source data have been read. If YES, the connection relationships of the circuit data expanded in the logic simulation dedicated machine memory 25 are set in accordance with the circuit structure descriptive data in the source file 21 and then stored in a suitable location in S67. If NO, the next data are read in S65 and the process returns to S61.

By the above processes, the circuit data relevant to the source data read from the source file 21 are read from the circuit data library 23 and expanded in the logic simulation dedicated machine memory 25, as shown in FIG. 19. By copying the same data, it expands the compiled circuit data in the logic simulation dedicated machine memory 25 with from a small amount of data from the source file 21.

Figure 21A:
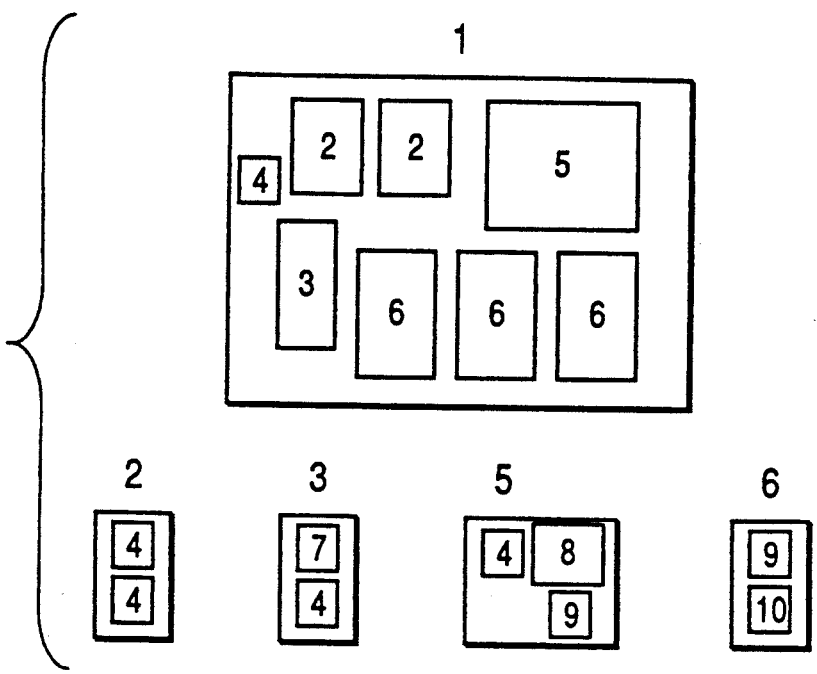
FIGS. 21A-21C are diagrams for explaining a circuit data generating system.
Figure 21B:
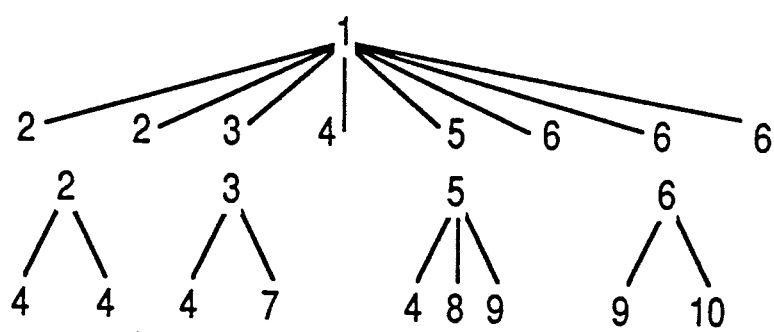
Figure 21C:
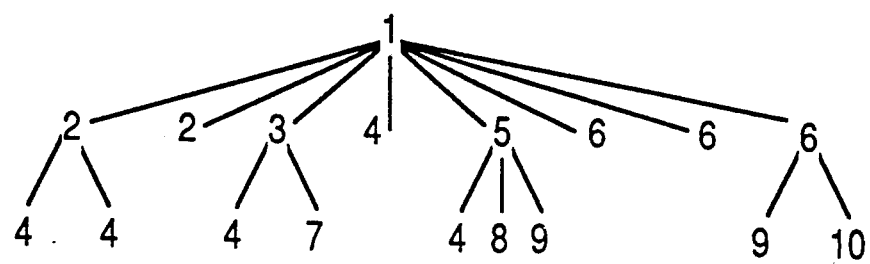
Figure 22:
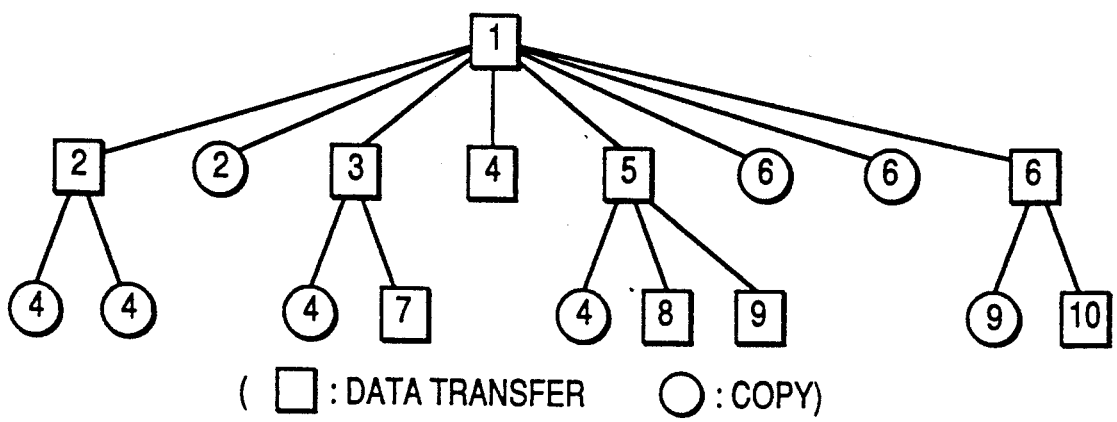
FIG. 22 is a diagram for explaining a circuit data generating system.

Next, a more specific description is made with reference to FIGS. 21A to 22.

FIG. 21A illustrates an example of circuit components. This is a schematic representation of circuit structures described in the source file 21. The component 1 is constructed from two components 2, one component 3, one component 4, one component 5 and three components 6. Furthermore, the component 2 is comprised of two components 4; the component 3 is comprised of one component 7 and one component 4; the component 5 is comprised of one component 4, one component 8 and one component 9; and the component 6 is comprised of one component 9 and one component 10.

FIG. 21B illustrates the hierarchical structures of the various components of FIG. 21A.

FIG. 21C illustrates the combined hierarchical structure of FIG. 21B.

FIG. 22 illustrates an example of the order of data transfer/copy. Here, "□" indicates a component whose data is transferred from the circuit data library 23 to the logic simulation dedicated machine memory 25 and expanded therein, while "○" indicates a component to be copied in the logic simulation dedicated machine memory 25. This is described hereinafter.

(1) The compile program 22 refers to the circuit data library 23 for components stored in the source file 21 and needed to configure the hierarchical structure of FIG. 21C, to obtain the sizes of memory areas and to determine addresses assigned to the components so that circuit data storage areas in the logic simulation dedicated machine memory 25 do not overlap.

(2) The "□" circuit data of FIG. 22 are taken from the circuit data library 23 to be transferred to the addresses, assigned in (1), of the logic simulation dedicated machine memory 25 and expanded. Here, the circuit data are transferred to the addresses assigned to the "□" components 1 to 10.

(3) The relevant "□" components are copied to the addresses assigned to the "○" components at the low level of FIG. 22. Here, four components 4 and one component 9 are copied from the "□" components 4 and 9, respectively.

(4) The relevant "□" components are copied to the addresses assigned to the "○" components at the second level of FIG. 22. Here, one component 2 and two components 6 are copied from the "□" components 2 and 6, respectively.

(5) The compile program 22 prepares data for connection among the components at the second level of FIG. 22 and stores it in a suitable memory address of the logic simulation dedicated machine memory 25.

(6) Data connected among all the components of FIG. 22 are read from the source file 21 and connection relationships among the components are prepared in accordance with the addresses assigned in (2) and addresses of input/output terminals of each component read from the circuit data library 23 to be stored in a suitable memory address of the logic simulation dedicated machine memory 25.

By performing the data transfer, expansion and copy in accordance with the above procedures, it becomes possible to expand components and their connection relationships on the logic simulation dedicated machine memory 25 in an optimized mode, with a small amount of processing, at a high speed.

Figure 23:
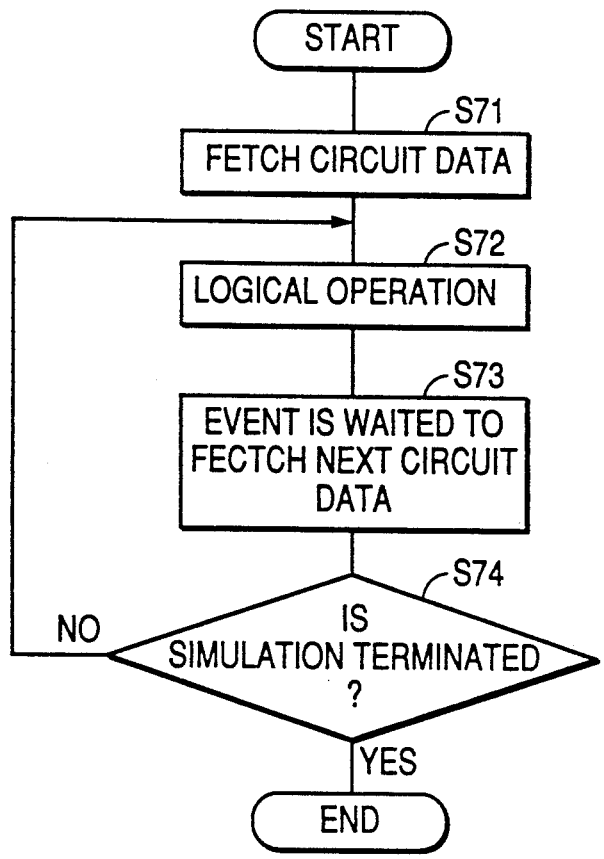
FIG. 23 is a flowchart of a simulation executing process of the third principle of the present invention.

FIG. 23 is a flowchart of the simulation executing process.

In FIG. 23, circuit data are fetched from the logic simulation dedicated machine memory 25 in S71.

In S72, a logical operation is performed.

In S73, an event is waited to fetch the next circuit data. A concrete example of the event here is such that a signal at the output pin of a gate A has gone to 1. When such an event occurs, the simulator fetches the destination to which the output pin of the gate A to be connected from the circuit data, updates a signal value of an input pin of the destination gate, and evaluates and updates a signal value of the output pin of the gate.

In S74, a decision is made as to whether or not the simulation has terminated. If YES, the simulation terminates. If NO, S72 and the following steps are repeated to perform the simulation of the logic circuit.

Finally, an embodiment provided in accordance with a fourth principle of the invention which is illustrated in FIG. 3, will be described.

Figure 24:
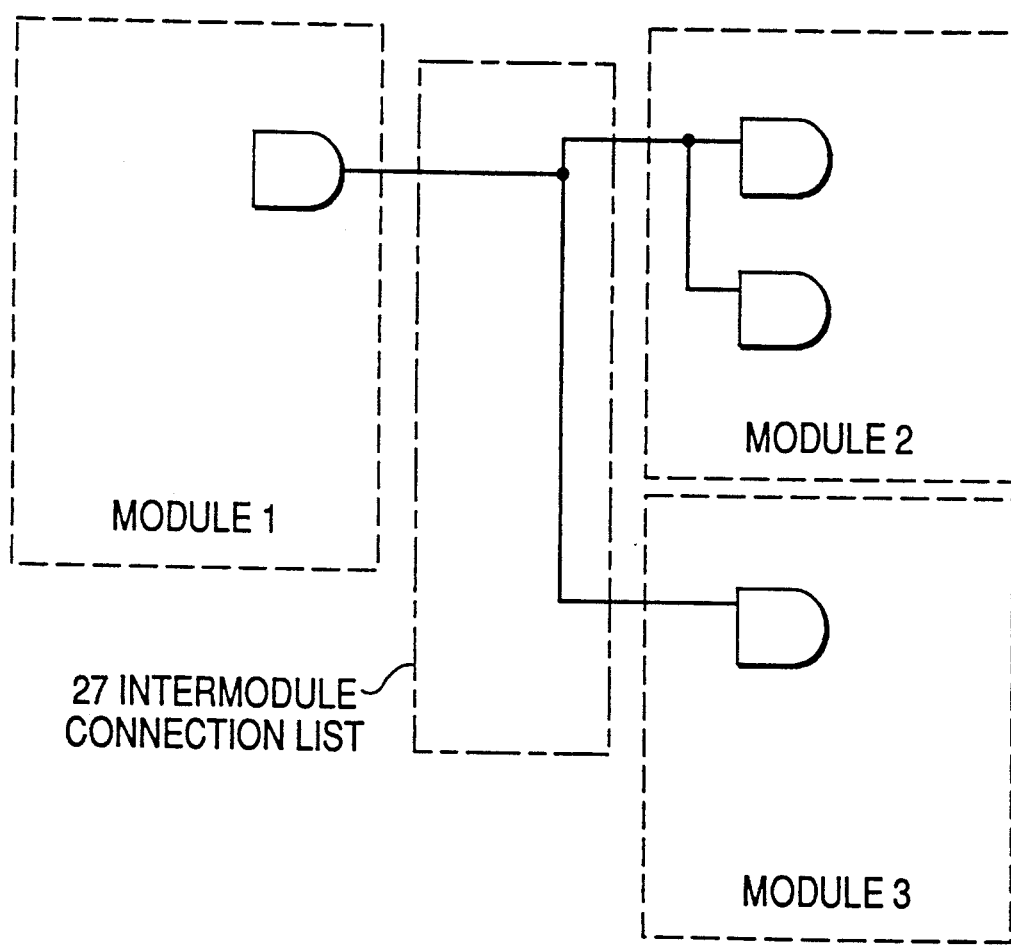
FIG. 24 is a block diagram for explaining an inter-module connecting system.

FIG. 24 is a diagram for explaining the intermodule connection system. Here, a circuit is constructed from a module 1, a module 2 and a module 3. Module 1 is connected to modules 2 and 3 via the intermodule connection list 27 described in conjunction with FIG. 3. If, therefore, there is a need for the destination of a module connection to be changed, only the intermodule connection list 27 has to be rewritten. The connection relationships within a module are set in the intramodule connection list 26. Thus, a simulation model for each module can be generated even at a stage in which the destinations of connection of external input and output pins are not found.

The intramodule connection list 26 comprises data for recording information on connection among gates of a module. The data are read from the intramodule connection list 26 by the simulation executing section 29 at the execution of simulation when the value of the output pin of each gate, which is obtained from logical values of its input pins, and the type of logical operation conducted in each gate is used as data for an input pin of a destination gate.

The intermodule connection list 27 comprises data for recording information on connection among external input and output pins of each module. When a gate within the module is connected to one of its external output pins, the data are read by the simulation executing section 29 to obtain data of an external input pin of another module. These data comprise the destination of connection of the external output pin.

Next, the intramodule connection list 26 and the intermodule connection list 27 will be described more specifically by using the example of module connection shown in FIG. 25A, in which case reference is made to FIG. 25B (before compilation), FIG. 26A (after compilation) and FIG. 26B (after compilation).

Figure 25A:
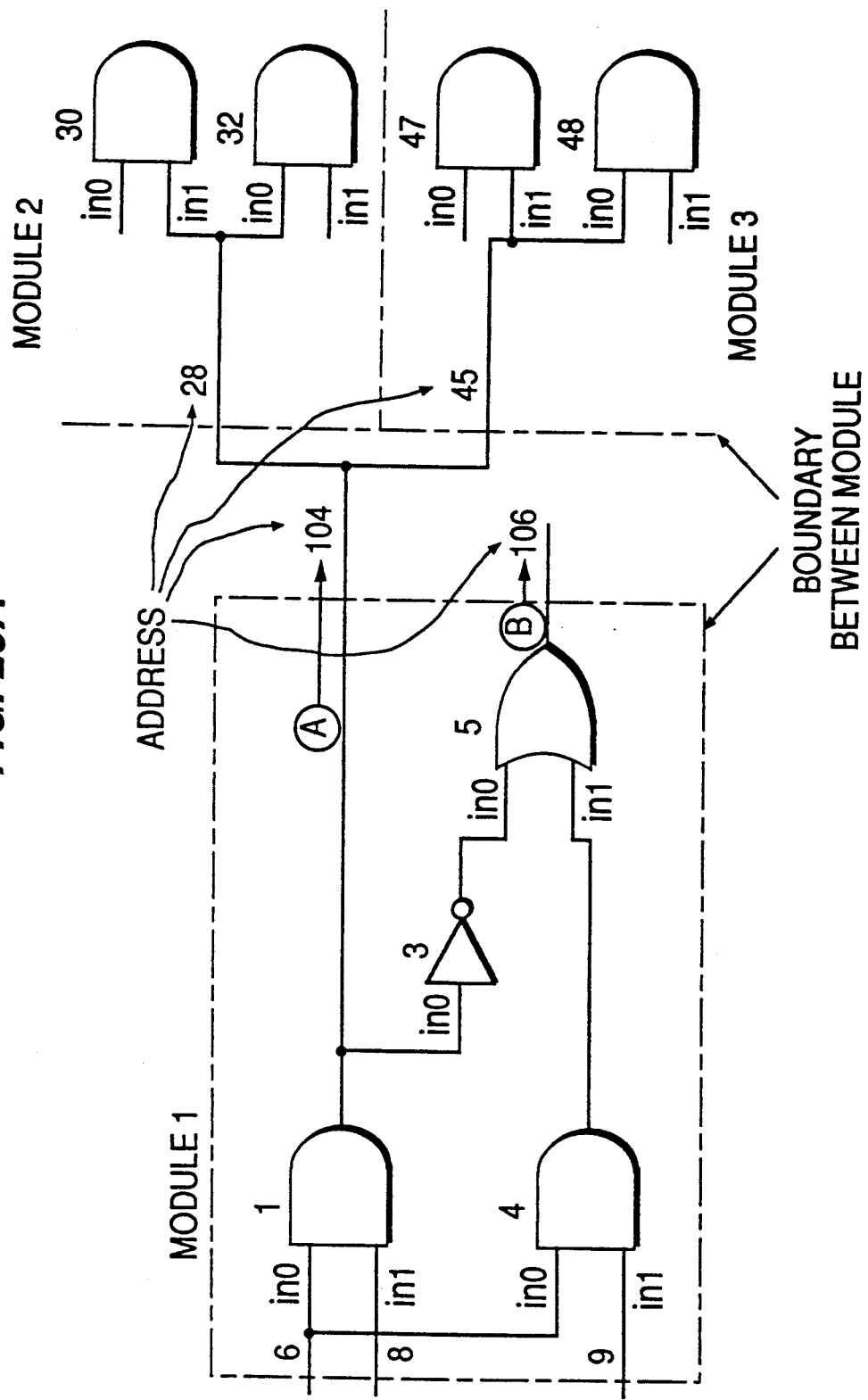

FIG. 25A illustrates an example of a module connection, in which a module 1 is connected to modules 2 and 3. In FIG. 25A reference numerals 1, 3, 4 and 5 assigned to gates in the module 1; 6, 8 and are assigned to input pins; and 104 and 106 are assigned to output pins and represent addresses. Likewise, module 2 and module 3 are assigned addresses as shown. The chain lines indicate the boundaries between modules.

FIG. 25B illustrates an example of the intramodule connection list 26 and the intermodule connection list 27 before compilation of the module 1.

In FIG. 25B, the intramodule connection list 26 is constructed from an intergate connection recording section 75 in which intergate connection information within the module is stored and an external input-to-gate connection recording section 76 in which information on connection between an external input and a gate is stored. In the intergate connection recording section 75, a specific number (address) of the destination of each gate output connection and an input pin number are stored for each address (gate number). For example, the record at address 1 (gate number 1 in FIG. 25A) in FIG. 25B stores 3-in0 (the gate of address 3 and the input pin number in0). The external input-to-gate connection recording section 76 stores the destination of an external input pin connection. For example, the record at address 6 stores 1-in0 (the gate of address 1 and the input pin number in0).

An end bit is used to store pieces of connection information for each address. For example, since the end bit of address 1 is 0 and the end bit of address 2 is 1, addresses 1 and 2 form a record in which connection information of gate 1 is stored.

An address bit is used to indicate that connection information stored in a record is an address. For example, addresses 2 and 5 store address information. In the present embodiment, addresses of the intermodule connection list 27 are stored at addresses 2 and 5 in the intramodule connection list 26.

The intermodule connection list 27 stores an address (address bit=1) of an external input pin of a module for each address.

Figure 26A:
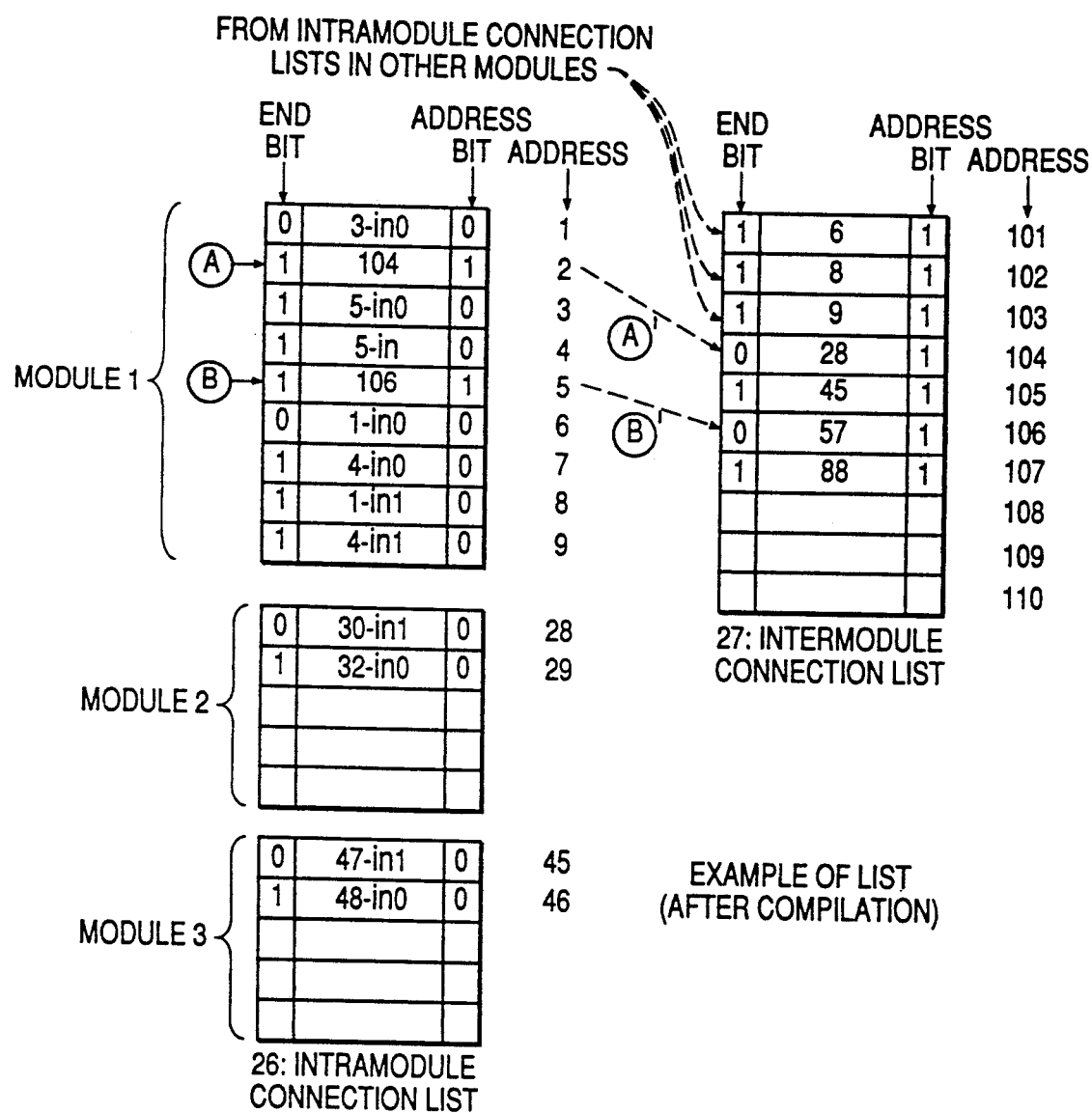
FIGS. 26A and 26B illustrate lists after compilation.

FIG. 26A illustrates a list example after compilation of the list example of FIG. 25B.

In FIG. 26A, address 104 is set in the record of ⒶⒶ in the intramodule connection list 26. This indicates that the specific number of the external output pin from the gate 1 (address 1) is 104 (address 104) as shown by ⒶⒶ in FIG. 25A. Likewise, address 106 is set in the record ⒷⒷ in the intramodule connection list 26. Address 28 is set in address 104 of ⒶⒶ' of the intermodule connection list 27 and address 45 is set (compiled) in the next address (the end bit=1). Although connection is not shown in FIG. 25A, address 57 is set in address 106 of ⒷⒷ' and address 88 is sent in the next address (end bit=1).

Figure 26B:
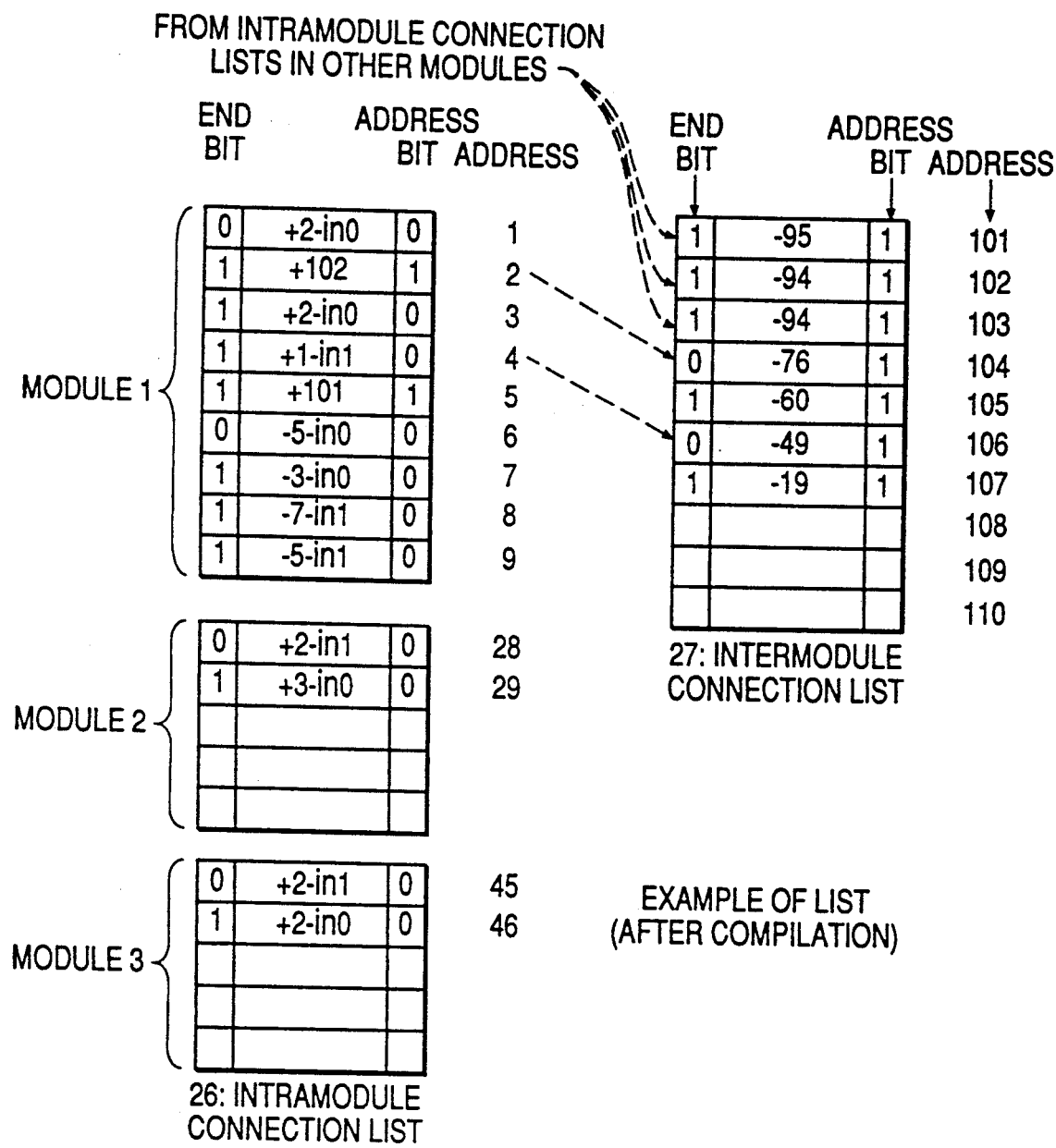

In FIG. 26B, the addresses of FIG. 26A are set in terms of absolute values. For example, in FIG. 26B, the connection information +2-in0 in the record of address 1 of the intramodule connection list 26 is made equal to address 3-in0 of connection information of the record of address 1 of the intramodule connection list 26 in FIG. 26A by adding relative address +2 to address 1. By setting addresses in terms of relative addresses, even if addresses are displaced in the memory of the list, the destination of connection can be specified correctly. Thus, it becomes possible to expand data in the simulation memory without, rewriting upon creating a higher order module by combining modules.

The above operations are performed to make (compile) the setting of connection information from module 1 to modules 2 and 3 in FIG. 25A. The entire simulation model (data) can be easily generated with the intramodule connection list 26 prepared for each of the modules 1, 2 and 3.

Figure 27A:
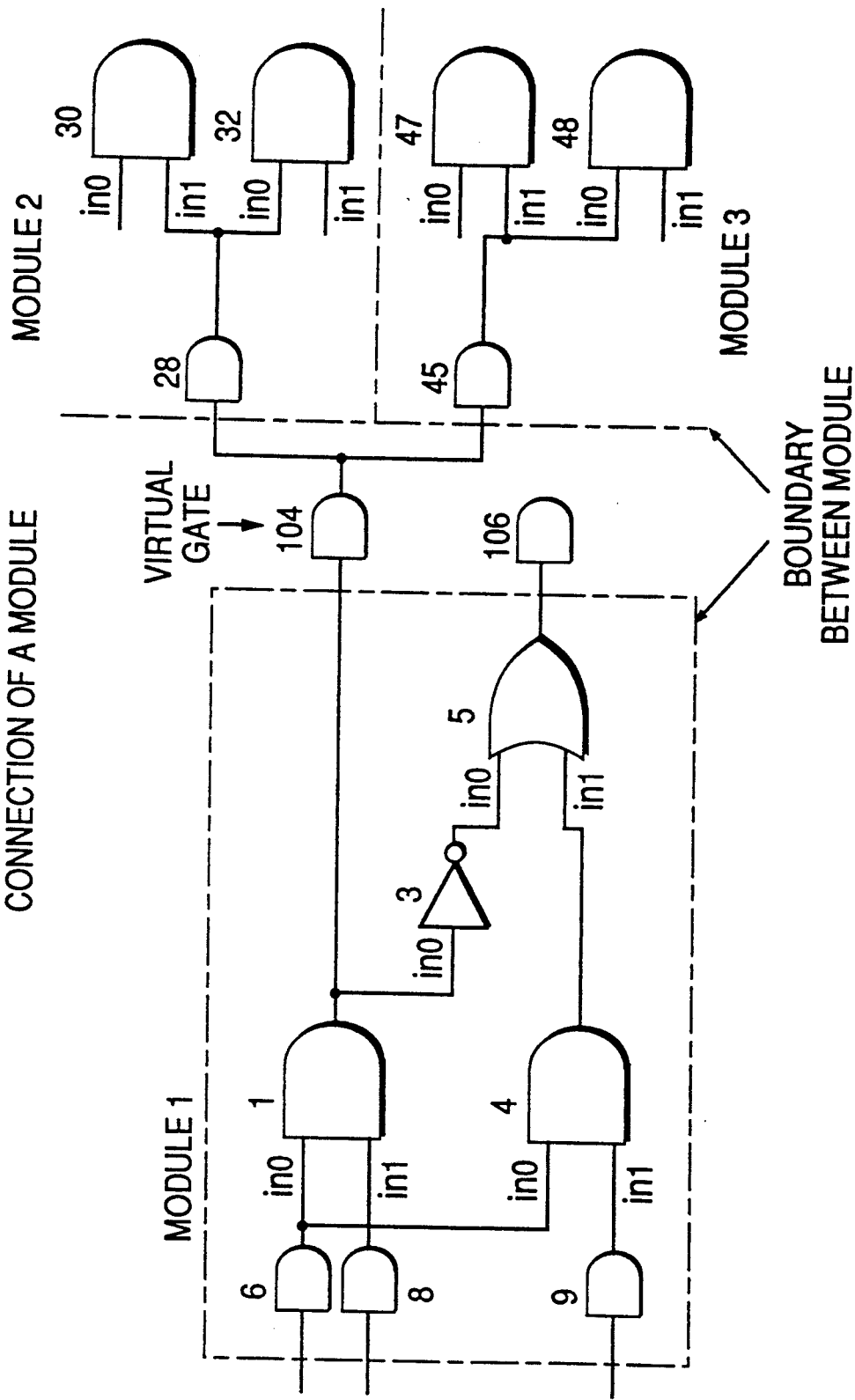

Next, a configuration and operation for connecting module 1 to modules 2 and 3 via virtual gates 104 and 106 which are introduced in the present embodiment as illustrated in FIG. 27A will be described. FIG. 27A results from rewriting of the connection example of modules of FIG. 25A using virtual gates.

FIG. 27B illustrates intramodule connection list 26 and intermodule connection list 27 for FIG. 27A. Here, in the record Ⓒ of address 2 in intramodule connection list 26 is set 104-in which represents an input to virtual gate 104. In the record Ⓒ' of address 104 of intermodule connection list 27 is set 28-in (virtual gate corresponding to an input pin of module 2 is 28). 45-in is set in the next address (end bit is 1). The addresses of FIG. 27B may be set in terms of relative addresses as described in conjunction with FIG. 26B.

The above operations are performed to make (compile) the setting of connection information from module 1 to modules 2 and 3 in FIG. 27A. By utilizing the intramodule connection list 26 prepared for each of the modules 1, 2 and 3, the entire simulation model (data) can be generated easily through the virtual gates.

Figure 28:
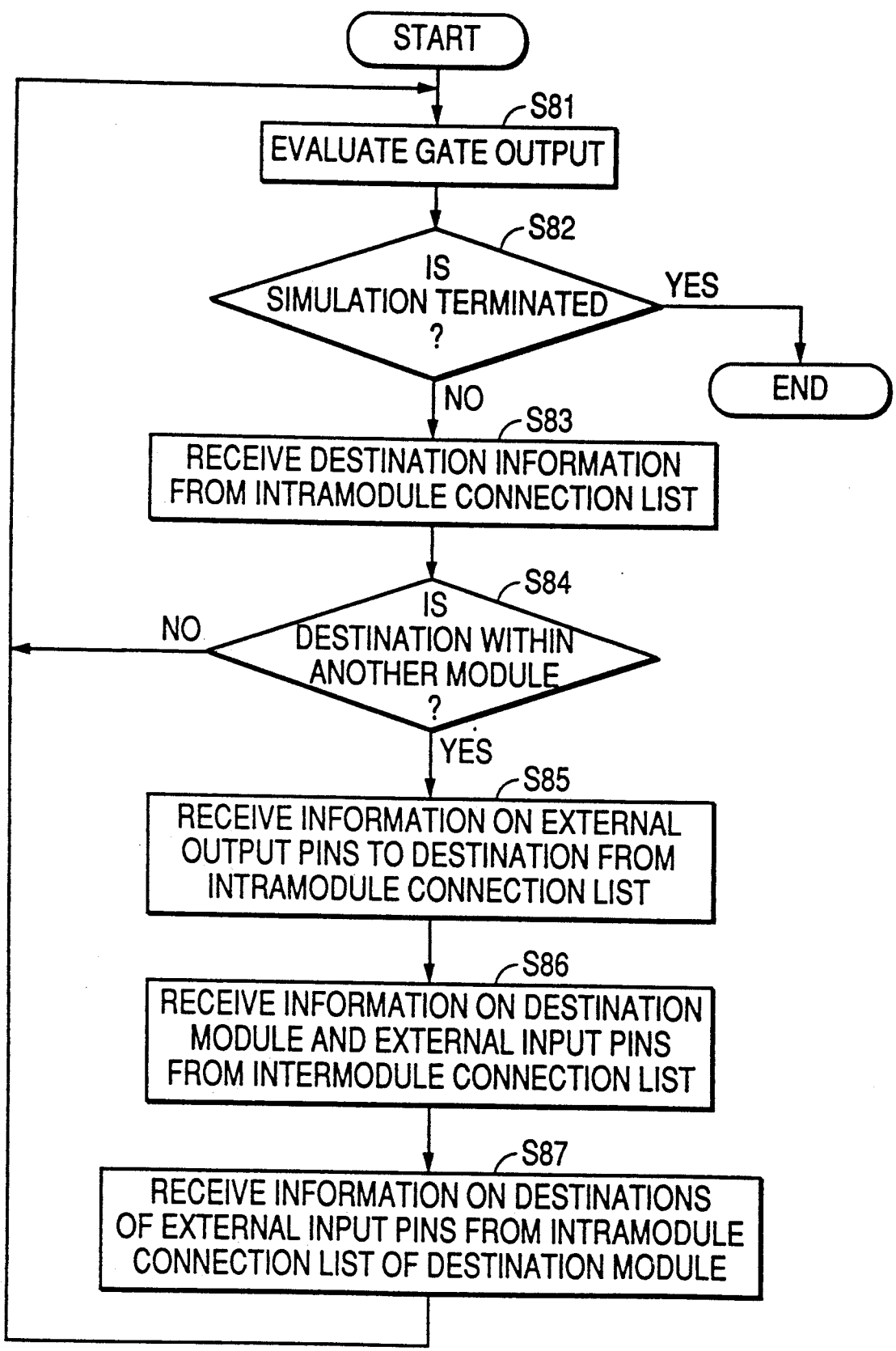
FIG. 28 is a flowchart of a simulation executing process using a list.
Figure 29:
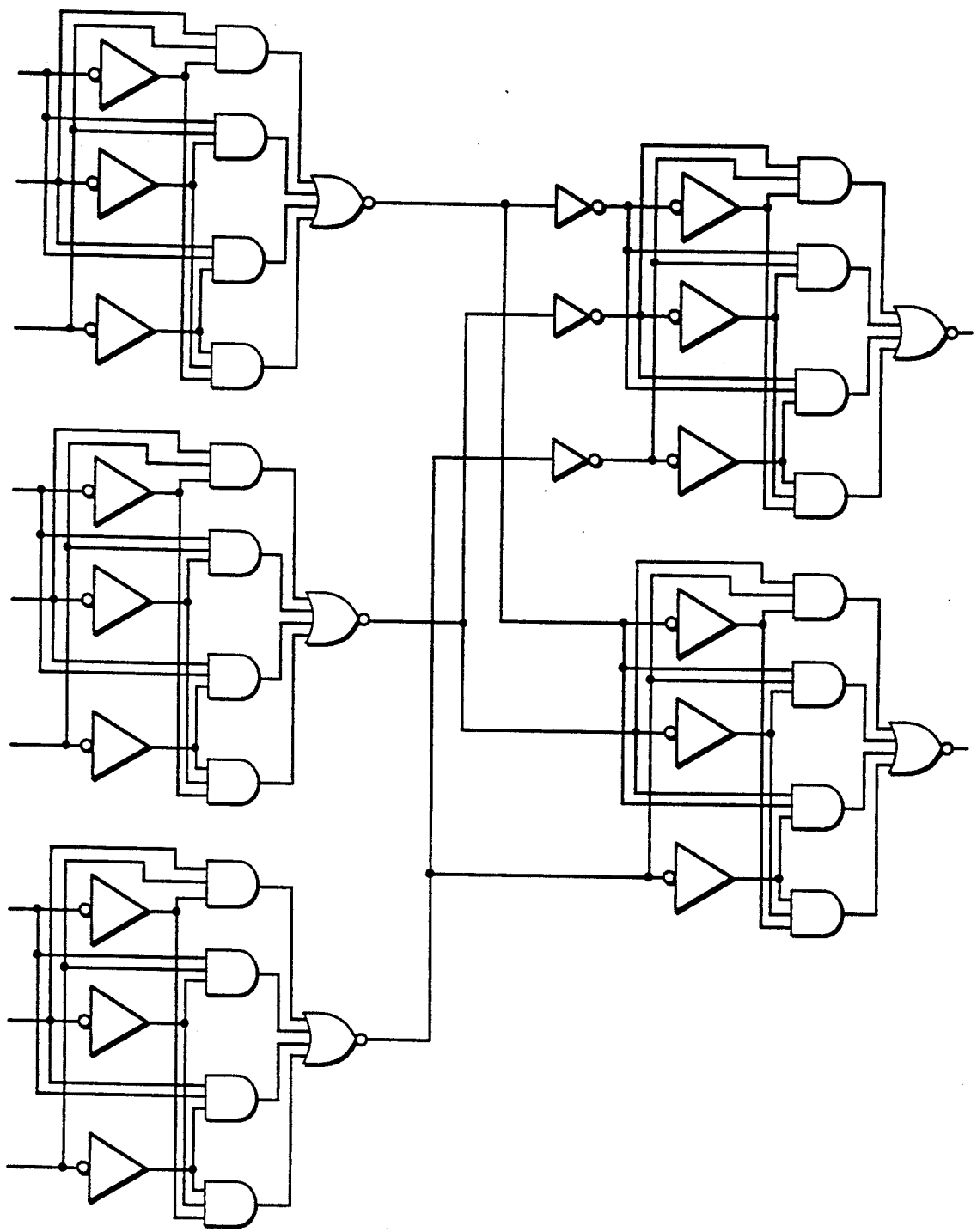
FIG. 29 is a diagram illustrating an example of a circuit connection relationship.

FIG. 28 is a flowchart of the simulation executing process using the lists 26 and 27.

In FIG. 28, a gate output is evaluated in S81. That is, the simulation execution section 29 in FIG. 3 obtains a logical value (gate output evaluation value) of the output pin of a gate in accordance with logical values of its input pins and the type of its logical operation.

In S82, a decision is made as to whether or not the simulation terminates. If YES, the simulation terminates, while, if NO, the process of S83 is performed.

In S83, the destination information is obtained from the intramodule connection list 26.

In S84, a decision is made as to whether or not the destination is within another module. If YES, the destination is within another module and the processes S85 to S87 are performed. If NO, the destination is turned out to be within the module itself and the processes of S81 to S83 are performed repeatedly to evaluate gate outputs within the module.

In S85, information on external output pins to the destination is obtained from the intramodule connection list 26.

In S86, information on the destination module and external input pins is received from the intermodule connection list 27.

In S87, information on destinations of external input pins is received from the intramodule connection list 26 of the destination module. The processes of S81 and following steps are performed repeatedly.

As described in detail above, according to the present invention, the compile time for a large-scale logic circuit can be considerably reduced and data can be taken out of a data base at high speed. This allows high-speed performance of a dedicated logic simulation machine to be fully displayed even at an initial design stage in which many design modifications occur.

By utilizing a hierarchical structure of modules or components, once circuit data are expanded in a memory of a dedicated machine, they can be copied for expansion in the memory when they are needed next, thus reducing the amount of processing at the time of compilation.

By utilizing an intramodule connection list and an intermodule connection list, the operation of compiling the whole simulation model from plural modules constituting a logic circuit can be performed easily.

What is claimed is:

1. A gate addressing system of a logic simulation machine for performing translation from data of input terminals and gates in a circuit design data base to circuit data for the logic simulation machine, said system comprising:

data means for outputting the circuit data from the circuit design data base including only a head address of a list having consecutive addresses equal in number to a number of fanout gates of one of the input terminals and gates; and memory means for storing at each address of the list a number obtained by subtracting the address from the number of the fanout gates.

2. A gate addressing system of a logic simulation machine for performing translation from data of a circuit design data base to circuit data for the logic simulation machine, comprising:

data means for outputting circuit data including identifying numbers for input terminals and gates of a circuit, the identifying numbers excluding intervening numbers between each set of consecutive first and second identifying numbers, the intervening numbers being determined based on a number of fanout gates to which an output signal associated with the first identifying number is applied; and memory means for storing a table representing connection relationships between the input terminals and the gates and among the gates, a list of the identifying numbers of the fanout gates receiving the output signal of each input terminal and gate at an address corresponding to the identifying number assigned to each input terminal and gate.

3. The gate addressing system of a logic simulation machine according to claim 2, wherein the intervening numbers for each set of consecutive first and second identifying numbers in the circuit data output by said data means have a count equal to the number of the fanout gates minus one, and wherein said memory means stores each list of numbers of the fanout gates at addresses corresponding to the intervening numbers following the first identifying number of each set of consecutive first and second identifying numbers.

4. The gate addressing system according to claim 3, wherein data used to produce the list of numbers of the fanout gates are represented in the circuit design data base in terms of values relative to addresses of the table.

5. The gate addressing system according to claim 3, wherein the circuit design data base includes a first fanout gate list containing a pointer to a second fanout gate list.

6. The gate addressing system according to claim 3, wherein, when the circuit includes a plurality of partial circuits having identical arrangements, using one partial circuit as a reference circuit, an offset value corresponds to each of the other partial circuits and said data means obtains the identifying numbers of the input terminals and the gates of the other partial circuits by adding the offset value corresponding thereto to the input terminals and the gates of the reference circuit.

7. A gate addressing system of a logic simulation machine for performing translation from data of a circuit design data base to circuit data for the logic simulation machine, comprising:

data means for outputting circuit data including identifying numbers for input terminals and gates of a circuit, when the circuit includes a plurality of partial circuits having identical arrangements, using one partial circuit as a reference circuit for each other partial circuit by adding an offset value corresponding thereto to the identifying numbers of the input terminals and the gates in the reference circuit; and memory means for storing a list of the identifying numbers of the input terminals and the identifying numbers of fanout gates connected to each gate in a table representing connection relationships between the input terminals and the gates and among the gates, by adding the offset value corresponding to each of the other partial circuits to a corresponding list of the identifying numbers of the input terminals and the fanout gates for the reference circuit.

8. The gate addressing system according to claim 7, wherein the circuit design data base includes a first fanout gate list containing a pointer to a second fanout gate list, and wherein said data means includes means for holding the offset value corresponding to each of the other partial circuits when a pointer is read and a fanout gate number is obtained by adding the offset value to data pointed to by the pointer.

9. A circuit data expansion system for generating a simulation machine circuit model in a memory of a logic simulation machine by compilation of source data, comprising:

a circuit data library for storing circuit data resulting from compilation of circuit components referred to by the source data; and means for executing a compile program for expanding the circuit data, corresponding to the source data, read from said circuit data library in the memory of the logic simulation machine and for copying expanded circuit data within the memory, corresponding to source data previously read in sequence and expanded by reference to said circuit data library, to another area in the memory by issuing a copy instruction to copy the expanded circuit data in the memory when the source data read corresponds to the expanded circuit data.

10. An intermediate connection system for generating a simulation circuit model for connection between modules having gates and pins, comprising:

an intramodule connection memory for storing connection information for the gates within each module for each address uniquely assigned to the gates and the pins and having a first area for storing for each module an address of an output pin connected to a receiving module;

an intermodule connection memory having a location for storing an address of an input pin within the receiving module connected to the output pin corresponding to the address stored in the first area of said intramodule connection memory; and means for inserting the address of the output pin in the first area of said intramodule connection memory and the address of the input pin within the receiving module in a second area of said intermodule connection memory designated by the address of the output pin.

* * * * *